(12) United States Patent
Song et al.

(10) Patent No.: US 12,113,160 B2
(45) Date of Patent: Oct. 8, 2024

(54) DISPLAY DEVICE

(71) Applicant: LG Display Co., Ltd., Seoul (KR)

(72) Inventors: JunHyuk Song, Seoul (KR); Hyokang Lee, Seoul (KR); Hyowon Kwon, Suwon-si (KR); MoonBae Gee, Paju-si (KR); KiHan Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 379 days.

(21) Appl. No.: 17/527,885

(22) Filed: Nov. 16, 2021

(65) Prior Publication Data

US 2022/0158057 A1    May 19, 2022

(30) Foreign Application Priority Data

Nov. 17, 2020  (KR) .................... 10-2020-0153424
Oct. 19, 2021  (KR) .................... 10-2021-0139771

(51) Int. Cl.
*H01L 33/62*   (2010.01)
*H01L 25/075*  (2006.01)
*H01L 25/16*   (2023.01)
*H01L 27/15*   (2006.01)
*H01L 33/00*   (2010.01)
(Continued)

(52) U.S. Cl.
CPC .......... *H01L 33/62* (2013.01); *H01L 27/156* (2013.01); *H01L 33/005* (2013.01); *H01L 2933/0066* (2013.01)

(58) Field of Classification Search
CPC ............... G09F 9/301; H10K 77/111; H10K 2102/311; H10K 59/124; H10K 59/131; H10K 59/1315; H10K 59/179; H10K 59/1795; H10K 59/82; H10K 59/84; H10K 59/86; H10K 59/8721; H10K 59/125; H01L 27/1214; H01L 27/156
See application file for complete search history.

(56) References Cited

U.S. PATENT DOCUMENTS 6,266,121 B1    7/2001  Shigeta et al.
8,994,634 B2 *  3/2015  Jo .................... G02F 1/13452
                                              345/98
(Continued)

FOREIGN PATENT DOCUMENTS

CN  110828510 A  2/2020
CN  111354766 A  6/2020
(Continued)

*Primary Examiner* — Sonya McCall-Shepard
(74) *Attorney, Agent, or Firm* — Seed IP Law Group LLP

(57) ABSTRACT

According to an aspect of the present disclosure, the display device includes a lower substrate and a plurality of pixel substrates disposed on the lower substrate. The display device also includes a plurality of transistors disposed on the plurality of pixel substrates and a planarization layer disposed on the plurality of pixel substrates to cover upper portions of the plurality of transistors. The display device further includes a plurality of individual connection pads and a common connection pad disposed on the planarization layer. The display device also includes a plurality of light emitting diodes disposed on the plurality of individual connection pads and the common connection pad. At least one of the plurality of individual connection pads and the common connection pad may have a multilayer structure.

23 Claims, 18 Drawing Sheets

(51) Int. Cl.
   *H10K 59/122*   (2023.01)
   *H10K 59/123*   (2023.01)
   *H10K 59/131*   (2023.01)

(56) References Cited

U.S. PATENT DOCUMENTS

| | | | |
|---|---|---|---|
| 9,420,703 | B2 | 8/2016 | Hayashi et al. |
| 9,837,388 | B2 * | 12/2017 | Rhee .................... H05B 33/145 |
| 10,483,434 | B2 * | 11/2019 | Liu .......................... H01L 33/62 |
| 2013/0194532 | A1 | 8/2013 | Morita |
| 2016/0218262 | A1 | 7/2016 | Aketa et al. |
| 2018/0190876 | A1 | 7/2018 | Liu et al. |
| 2019/0181122 | A1 | 6/2019 | Hsu et al. |
| 2020/0212117 | A1 | 7/2020 | Jeon et al. |
| 2020/0343227 | A1 | 10/2020 | Jang et al. |
| 2021/0134191 | A1 | 5/2021 | Jung et al. |

FOREIGN PATENT DOCUMENTS

| | | | |
|---|---|---|---|
| CN | 111383531 | A | 7/2020 |
| EP | 3608964 | A1 | 2/2020 |
| EP | 3675178 | A1 | 7/2020 |
| JP | 2013152409 | A | 8/2013 |
| JP | 2020106832 | A | 7/2020 |
| KR | 1998-042841 | A | 8/1998 |
| KR | 10-2013-0010246 | A | 1/2013 |
| KR | 10-2014-0086951 | A | 7/2014 |
| KR | 20180012942 | A * | 2/2018 |
| KR | 10-2018-0094620 | A | 8/2018 |
| KR | 10-2019-0076929 | A | 7/2019 |
| KR | 20200045904 | A * | 5/2020 |
| KR | 10-2021-0054323 | A | 5/2021 |
| TW | 202008579 | A | 2/2020 |
| WO | WO 2015033557 | A1 | 3/2015 |
| WO | WO 2020218850 | A1 | 10/2020 |

* cited by examiner

DISPLAY DEVICE

CROSS-REFERENCE TO RELATED APPLICATIONS

This application claims the priority of Korean Patent Application No. 10-2020-0153424 filed on Nov. 17, 2020, and Korean Patent Application No. 10-2021-0139771 filed on Oct. 19, 2021, in the Korean Intellectual Property Office, the disclosure of which is incorporated herein by reference.

BACKGROUND

Technical Field

The present disclosure relates to a display device, and more particularly, to a stretchable display device with an improved reliability of connection lines.

Description of the Related Art

Display devices employed by the monitor of a computer, a TV, a mobile phone or the like include an organic light emitting display (OLED) device that emits light by itself, and a liquid crystal display (LCD) device that requires a separate light source.

As the display devices have been increasingly applied to diverse fields such as a computer monitor, a TV, and a personal mobile device, display devices having a large active area and a reduced volume and weight have been studied.

BRIEF SUMMARY

The inventors of the present disclosure have appreciated the benefits of having a stretchable display device in which display elements, lines, etc., are formed on a flexible substrate made of flexible plastic and which can be stretched in a specific direction and manufactured in various shapes.

Accordingly, one or more embodiments of the present disclosure provide a display device which can be manufactured while reducing or minimizing tearing-off of a pad during a process of repairing a light emitting diode misaligned when the light emitting diode is transferred and bonded to a pixel substrate.

One or more embodiments of the present disclosure provide a display device which can be manufactured while suppressing misalignment of a light emitting diode caused by movement of an adhesive layer that bonds the light emitting diode when the light emitting diode is transferred and bonded to the pixel substrate.

One or more embodiments of the present disclosure provide a display device which can be manufactured while suppressing the occurrence of a dark spot caused by misalignment of a light emitting diode and a short circuit between a power line and a common connection pad.

One or more embodiments of the present disclosure provide a display device which can be manufactured while suppressing the occurrence of a short or open of a light emitting diode caused by non-uniform distribution of conductive balls in an adhesive layer that bonds the light emitting diode when the light emitting diode is transferred and bonded to the pixel substrate.

One or more embodiments of the present disclosure provide a display device which can be manufactured while suppressing a transfer efficiency decrease and defective driving of a light emitting diode caused by non-uniform placement of an adhesive layer that bonds the light emitting diode when the light emitting diode is transferred.

Further embodiments of the present disclosure provide a method of manufacturing a display device in which an adhesive layer is selectively transferred onto the entire upper surface of a planarization layer to simplify a manufacturing process.

Technical benefits of the present disclosure are not limited to the above-mentioned benefits, and other benefits, which are not mentioned above, can be clearly understood by those skilled in the art from the following descriptions.

According to an aspect of the present disclosure, the display device includes: a lower substrate and a plurality of pixel substrates disposed on the lower substrate. The display device also includes a plurality of transistors disposed on the plurality of pixel substrates and a planarization layer disposed on the plurality of pixel substrates to cover upper portions of the plurality of transistors. The display device further includes a plurality of individual connection pads and a common connection pad disposed on the planarization layer. The display device also includes a plurality of light emitting diodes disposed on the plurality of individual connection pads and the common connection pad. At least one of the plurality of individual connection pads and the common connection pad may have a multilayer structure.

According to another aspect of the present disclosure, the display device includes: a plurality of pixel substrates which is disposed on a lower substrate and in which a plurality of light emitting diodes is disposed. The display device also includes a planarization layer covering upper portions of the plurality of pixel substrates. The display device further includes a plurality of individual connection pads disposed on the planarization layer so as to correspond to the plurality of light emitting diodes, respectively. The display device also includes a common connection pad disposed on the planarization layer and electrically connected to all of the plurality of light emitting diodes. The display device further includes an adhesive layer electrically connecting the plurality of individual connection pads and the common connection pad to the plurality of light emitting diodes. At least one of the plurality of individual connection pads and the common connection pad may have a lower pad and an upper pad disposed on an edge of the lower pad.

According to yet another aspect of the present disclosure, the display device includes: a plurality of pixel substrates which is disposed on a lower substrate and on which a plurality of light emitting diodes is disposed. The display device also includes a planarization layer covering upper portions of the plurality of pixel substrates. The display device further includes a plurality of individual connection pads disposed on the planarization layer and corresponding to the plurality of light emitting diodes, respectively. The display device also includes a common connection pad disposed on the planarization layer and electrically connected to all of the plurality of light emitting diodes. The display device further includes an adhesive layer electrically connecting the plurality of individual connection pads and the common connection pad to the plurality of light emitting diodes and disposed to cover the entire upper surface of the planarization layer.

According to still another aspect of the present disclosure, the method of manufacturing a display device includes: a process of placing an adhesive layer, which includes a base member and a plurality of conductive balls dispersed in the base member, on a first transfer substrate. The method of manufacturing a display device also includes a process of bringing the first transfer substrate close to an upper portion of a substrate, on which a planarization layer covering upper portions of a plurality of transistors is disposed, and bonding the adhesive layer to an upper portion of the planarization layer. The method of manufacturing a display device further includes a process of bringing a second transfer substrate, on which a plurality of light emitting diodes is disposed, close to an upper portion of the adhesive layer and bonding the plurality of light emitting diodes to the upper portion of the adhesive layer.

Other detailed matters of the embodiments are included in the detailed description and the drawings.

According to the present disclosure, it is possible to reduce or minimize the occurrence of a defect caused by damage to a pad during a process of repairing an area where a light emitting diode is misaligned.

According to the present disclosure, it is possible to reduce or minimize misalignment of a light emitting diode which may occur when an adhesive layer for electrically connecting the light emitting diode and a pad is moved.

According to the present disclosure, it is possible to suppress the occurrence of a dark spot caused by an electrical connection between a pad and a power line by an electrode of a light emitting diode when the light emitting diode is transferred and bonded to the pixel substrate.

According to the present disclosure, a plurality of conductive balls for electrically connecting an electrode of a light emitting diode and a pad is spaced apart from each other in a single layer. Therefore, it is possible to suppress the occurrence of a short or open of a light emitting diode.

According to the present disclosure, an adhesive layer for electrically connecting a light emitting diode and a pad is disposed on the entire upper surface of a planarization layer. Therefore, it is possible to reduce or minimize a transfer efficiency decrease and defective driving of the light emitting diode caused by non-uniform placement of the adhesive layer.

According to the present disclosure, it is possible to simplify a manufacturing process by bonding an adhesive layer on the entire upper surface of a planarization layer. Also, it is possible to reduce or minimize manufacturing time and cost.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
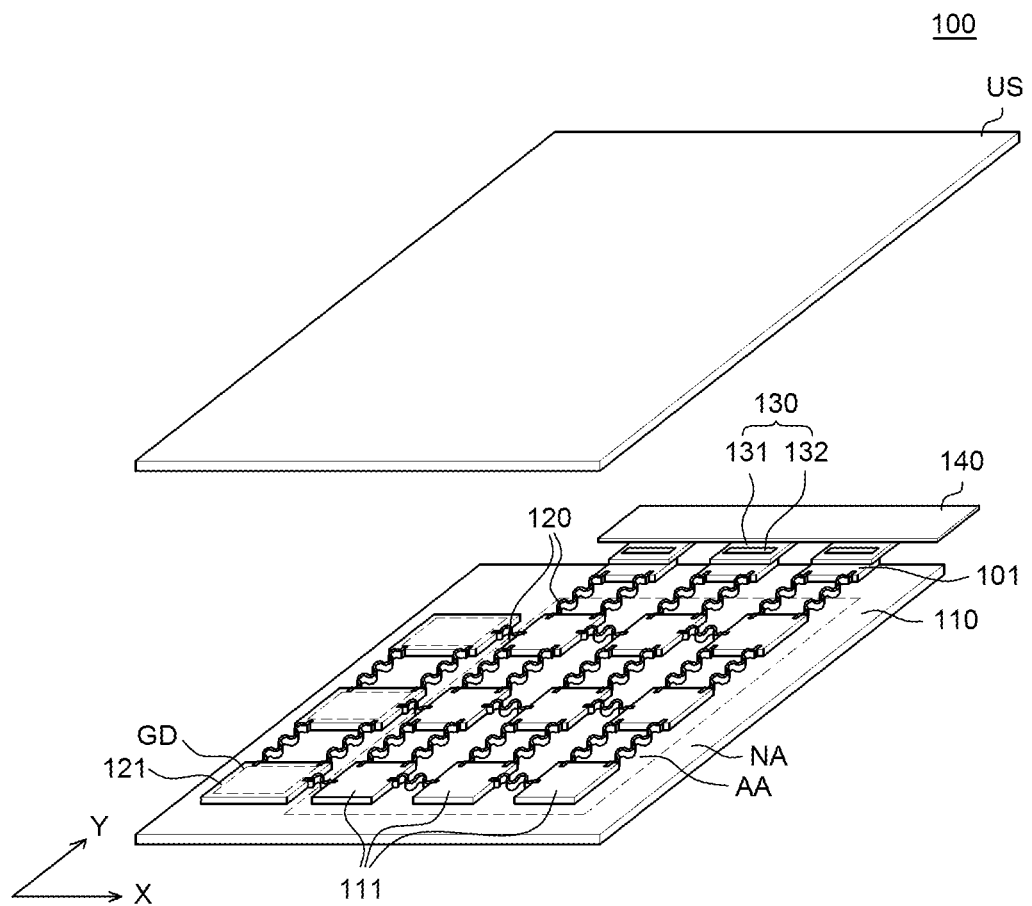
FIG. 1 is an exploded perspective view of a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to embodiments of the present disclosure will be described in detail with reference to accompanying drawings.

Stretchable Display Device

A stretchable display device may be referred to as a display device capable of displaying an image even when bent or stretched. The stretchable display device may have higher flexibility than conventional typical display devices. Thus, a user may bend or stretch the stretchable display device, and the shape of the display device may be freely changed in response to a manipulation of the user. For example, when the user seizes an end of the stretchable display device and pulls the stretchable display device, the stretchable display device may be stretched by a force of the user. When the user places the stretchable display device on an uneven wall surface, the stretchable display device may be bent along the shape of the wall surface. Also, when a force applied by the user is removed, the display device may be restored to its original shape.

FIG. 1 is an exploded perspective view of a display device according to an embodiment of the present disclosure. Referring to FIG. 1, a display device 100 includes a lower substrate 110, a plurality of pixel substrates 111, a plurality of connection members 120, a plurality of non-pixel substrates 121, a Chip on Film (COF) 130, a printed circuit board 140 and an upper substrate US.

The lower substrate 110 is a substrate for supporting and protecting various components of the display device 100. The lower substrate 110 is a ductile substrate and may be made of a bendable or stretchable insulating material. For example, the lower substrate 110 may be made of silicone rubber such as polydimethylsiloxane (PDMS) and an elastomer such as polyurethane (PU), or polytetrafluoroethylene (PTFE). Thus, the lower substrate 110 may have flexible properties. However, a material of the lower substrate 110 is not limited thereto.

The lower substrate 110 is a ductile substrate and may be reversibly expandable and contractible. Further, the lower substrate 110 may have an elastic modulus in the range of several to hundreds of MPa, for example, 0.5 MPa to 1 MPa.

The lower substrate 110 may have an active area AA and a non-active area NA surrounding the active area AA.

The active area AA is an area where an image is displayed on the display device 100. In the active area AA, a display element and various driving elements for driving the display element are disposed. In the active area AA, a plurality of pixels including a plurality of sub-pixels is disposed. The plurality of pixels is disposed in the active area AA and includes a plurality of display elements. Each of the plurality of sub-pixels may be connected to various lines. For example, each of the plurality of sub-pixels may be connected to various lines such as a gate line, a data line, a high-potential power line, a low-potential power line and a reference voltage line.

The non-active area NA may be an area disposed adjacent to the active area AA. The non-active area NA may be an area disposed adjacent to the active area AA and surrounding the active area AA. The non-active area NA is an area where an image is not displayed, and in the non-active area NA, lines and circuit units may be formed. For example, in the non-active area NA, a plurality of pads may be disposed. Each of the pads may be connected to each of the plurality of sub-pixels disposed in the active area AA.

The plurality of pixel substrates 111 and the plurality of non-pixel substrates 121 are disposed on the lower substrate 110. The plurality of pixel substrates 111 may be disposed in the active area AA of the lower substrate 110, and the plurality of non-pixel substrates 121 may be disposed in the non-active area NA of the lower substrate 110. Although FIG. 1 illustrates that the plurality of non-pixel substrates 121 is disposed on the upper and left sides of the active area AA in the non-active area NA, the present disclosure is not limited thereto. The plurality of non-pixel substrates 121 may be disposed in an arbitrary area of the non-active area NA.

The plurality of pixel substrates 111 and the plurality of non-pixel substrates 121 are rigid substrates and are spaced apart from each other to be independently disposed on the lower substrate 110. The plurality of pixel substrates 111 and the plurality of non-pixel substrates 121 may be more rigid than the lower substrate 110. That is, the lower substrate 110 may be more ductile than the plurality of pixel substrates 111 and the plurality of non-pixel substrates 121. Also, the plurality of pixel substrates 111 and the plurality of non-pixel substrates 121 may be more rigid than the lower substrate 110.

The plurality of pixel substrates 111 and the plurality of non-pixel substrates 121, which are rigid substrates, may be made of a plastic material having flexibility. For example, the plurality of pixel substrates 111 and the plurality of non-pixel substrates 121 may be made of polyimide (PI), polyacrylate, polyacetate, or the like. Here, the plurality of pixel substrates 111 and the plurality of non-pixel substrates 121 may be made of the same material, but are not limited thereto. The plurality of pixel substrates 111 and the plurality of non-pixel substrates 121 may also be made of different materials from each other.

The moduli of the plurality of pixel substrates 111 and the plurality of non-pixel substrates 121 may be 1000 times or more higher than that of the lower substrate 110, but is not limited thereto. For example, elastic moduli of the plurality of pixel substrates 111 and the plurality of non-pixel substrates 121 may be 2 GPa to 9 GPa depending on a transparency. More specifically, when the plurality of pixel substrates 111 and the plurality of non-pixel substrates 121 are transparent, the elastic moduli may be 2 GPa. Also, when the plurality of pixel substrates 111 and the plurality of non-pixel substrates 121 are opaque, the elastic moduli may be 9 GPa, but the present disclosure is not limited thereto. Accordingly, the plurality of pixel substrates 111 and the plurality of non-pixel substrates 121 may be a plurality of rigid substrates having rigidity as compared with the lower substrate 110.

The COF 130 is a film on which various components are disposed on a base film 131 having ductility and supplies signals to the plurality of sub-pixels of the active area AA. The COF 130 may be bonded to a plurality of pads of the plurality of non-pixel substrates 121 disposed in the non-active area NA. Also, the COF 130 supplies a power voltage, a data voltage, a gate voltage or the like to each of the plurality of sub-pixels of the active area AA through the pads. The COF 130 includes the base film 131 and a driving IC 132. Further, various components may be additionally disposed thereon.

The base film 131 serves to support the driving IC 132 of the COF 130. The base film 131 may be made of an insulating material. For example, the base film 131 may be made of an insulating material having flexibility.

The driving IC 132 is configured to process data for displaying an image and a drive signal for processing the data. FIG. 1 illustrates that the driving IC 132 is mounted by a method of the COF 130, but the present disclosure is not limited thereto. The driving IC 132 may also be mounted by a Chip On Glass (COG) method, a Tape Carrier Package (TCP) method, or the like.

FIG. 1 illustrates that a non-pixel substrate 121 is disposed in the non-active area NA on an upper side of the active area AA so as to correspond to the pixel substrates 111 in a row disposed in the active area AA. Also, FIG. 1 illustrates that a COF 130 is disposed for a non-pixel substrate 121. However, the present disclosure is not limited thereto. That is, a non-pixel substrate 121 and a COF 130 may be disposed so as to correspond to pixel substrates 111 in a plurality of rows.

In the printed circuit board 140, a control unit such as an IC chip, a circuit, or the like may be mounted. Further, in the printed circuit board 140, a memory, a processor, or the like may also be mounted. The printed circuit board 140 is configured to transmit a signal for driving a display element from the control unit to the display element. Although FIG. 1 illustrates that three COFs 130 are used, the number of COFs 130 is not limited thereto.

Hereinafter, the display device 100 according to an embodiment of the present disclosure will be described in more detail with reference to FIG. 2 and FIG. 3.

Planar and Cross-Sectional Structures

Figure 2:
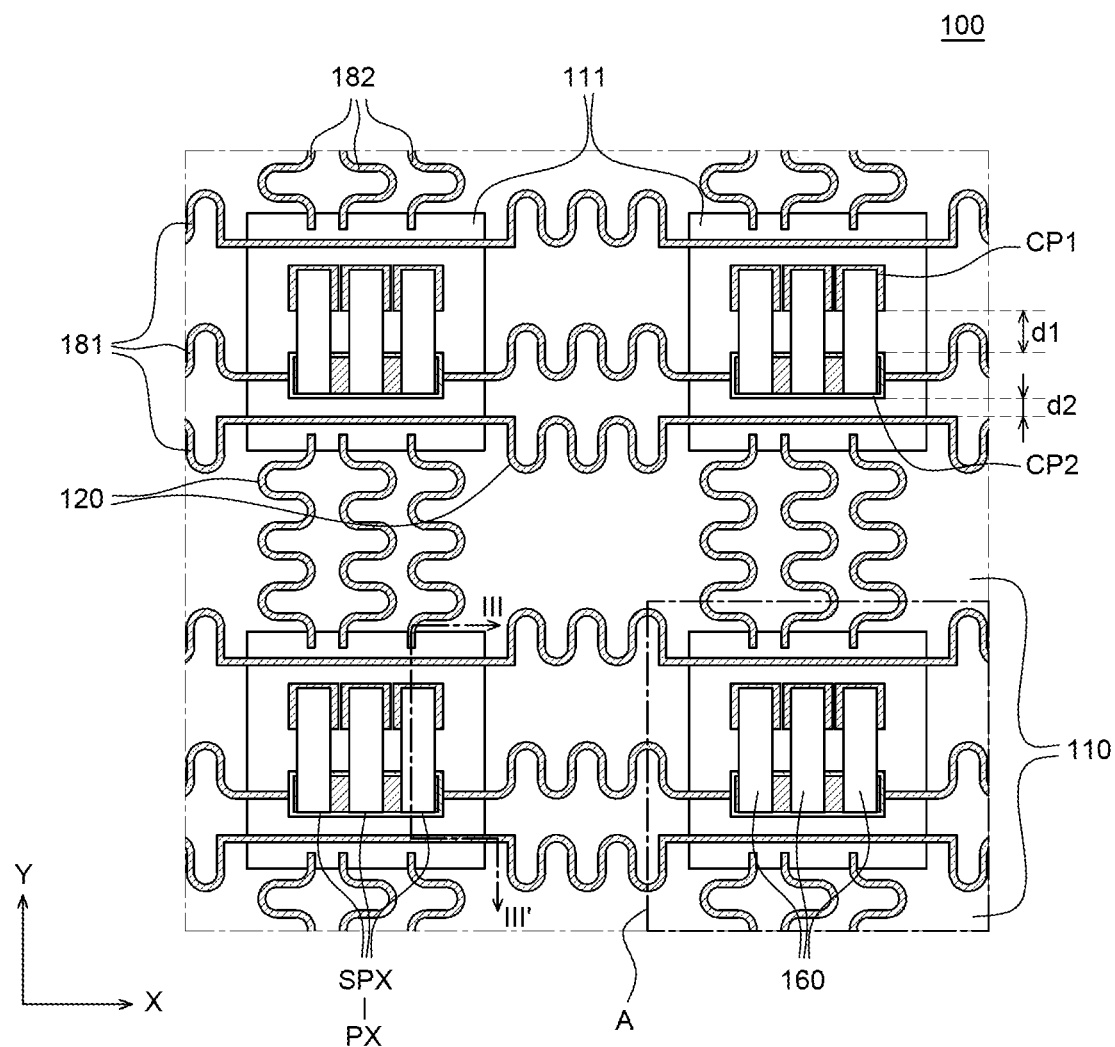
FIG. 2 is an enlarged plan view of the display device according to an embodiment of the present disclosure.

FIG. 2 is an enlarged plan view of the display device according to an embodiment of the present disclosure. FIG. 3 is a schematic cross-sectional view of a sub-pixel of FIG. 2. For the convenience of description, FIG. 1 will also be referred to hereinafter.

Referring to FIG. 1 and FIG. 2, the plurality of pixel substrates 111 is disposed on the lower substrate 110 in the active area AA. The plurality of pixel substrates 111 is disposed to be spaced apart from each other on the lower substrate 110. For example, the plurality of pixel substrates 111 may be disposed in a matrix form on the lower substrate 110 as shown in FIG. 1 and FIG. 2, but is not limited thereto.

Referring to FIG. 1 and FIG. 2, a plurality of sub-pixels SPX constituting a plurality of pixels PX may be disposed in the plurality of pixel substrates 111. Also, gate drivers GD may be mounted on the non-pixel substrates 121 located at the left side of the active area AA among the plurality of non-pixel substrates 121. The gate drivers GD may be formed on the non-pixel substrates 121 in a Gate In Panel (GIP) manner when various components on the pixel substrates 111 are manufactured. Accordingly, various circuit components, such as various transistors, capacitors and lines, constituting the gate drivers GD may be disposed on the plurality of non-pixel substrates 121. However, the present disclosure is not limited thereto. The gate drivers GD may also be mounted in a Chip on Film (COF) manner. The plurality of non-pixel substrates 121 may also be disposed in the non-active area NA located on the right side of the active area AA. Further, the gate drivers GD may also be mounted on the plurality of non-pixel substrates 121 located on the right side of the active area AA.

Referring to FIG. 1, the plurality of non-pixel substrates 121 may have a greater size than the plurality of pixel substrates 111. Specifically, each of the plurality of non-pixel substrates 121 may have a greater size than each of the plurality of pixel substrates 111. As described above, the gate driver GD is disposed on each of the plurality of non-pixel substrates 121. For example, one stage of the gate driver GD may be disposed on each of the plurality of non-pixel substrates 121. Accordingly, since an area occupied by various circuit components constituting one stage of the gate driver GD is relatively greater than an area of the pixel substrate 111 on which the pixel PX is disposed, the size of each of the plurality of non-pixel substrates 121 may be greater than the size of each of the plurality of pixel substrates 111.

Referring to FIG. 1 and FIG. 2, the plurality of connection members 120 is disposed between the plurality of pixel substrates 111, between the plurality of non-pixel substrates 121, or between the plurality of pixel substrates 111 and the plurality of non-pixel substrates 121. The plurality of connection members 120 serves to connect the pixel substrates 111 adjacent to each other, the non-pixel substrates 121 adjacent to each other, or the pixel substrates 111 and the non-pixel substrates 121 to each other. The plurality of connection members 120 may also be referred to as connection substrates. The plurality of connection members 120 may be made of the same material as the pixel substrates 111 or the non-pixel substrates 121 and may be formed integrally with the pixel substrates 111 or the non-pixel substrates 121 at the same time. However, the present disclosure is not limited thereto.

Referring to FIG. 2, the plurality of connection members 120 has a curved shape. For example, as shown in FIG. 2, the plurality of connection members 120 may have a sine wave shape. However, the shape of the plurality of connection members 120 is not limited thereto. The plurality of connection members 120 may have various shapes. For example, the plurality of connection members 120 may be extended in a zigzag manner, or a plurality of diamond-shaped substrates may be extended by being connected to each other at their vertices. The number and shape of the plurality of connection members 120 shown in FIG. 2 are provided by way of example. The number and shape of the plurality of connection members 120 may vary depending on the design.

Referring to FIG. 2, a plurality of connection lines 181 and 182 is disposed in straight lines on the plurality of pixel substrates 111. Specifically, each of a plurality of first connection lines 181 and a plurality of second connection lines 182 may be continuously formed on the plurality of connection members 120 to connect one ends to the other ends of the plurality of pixel substrates 111.

Figure 3:
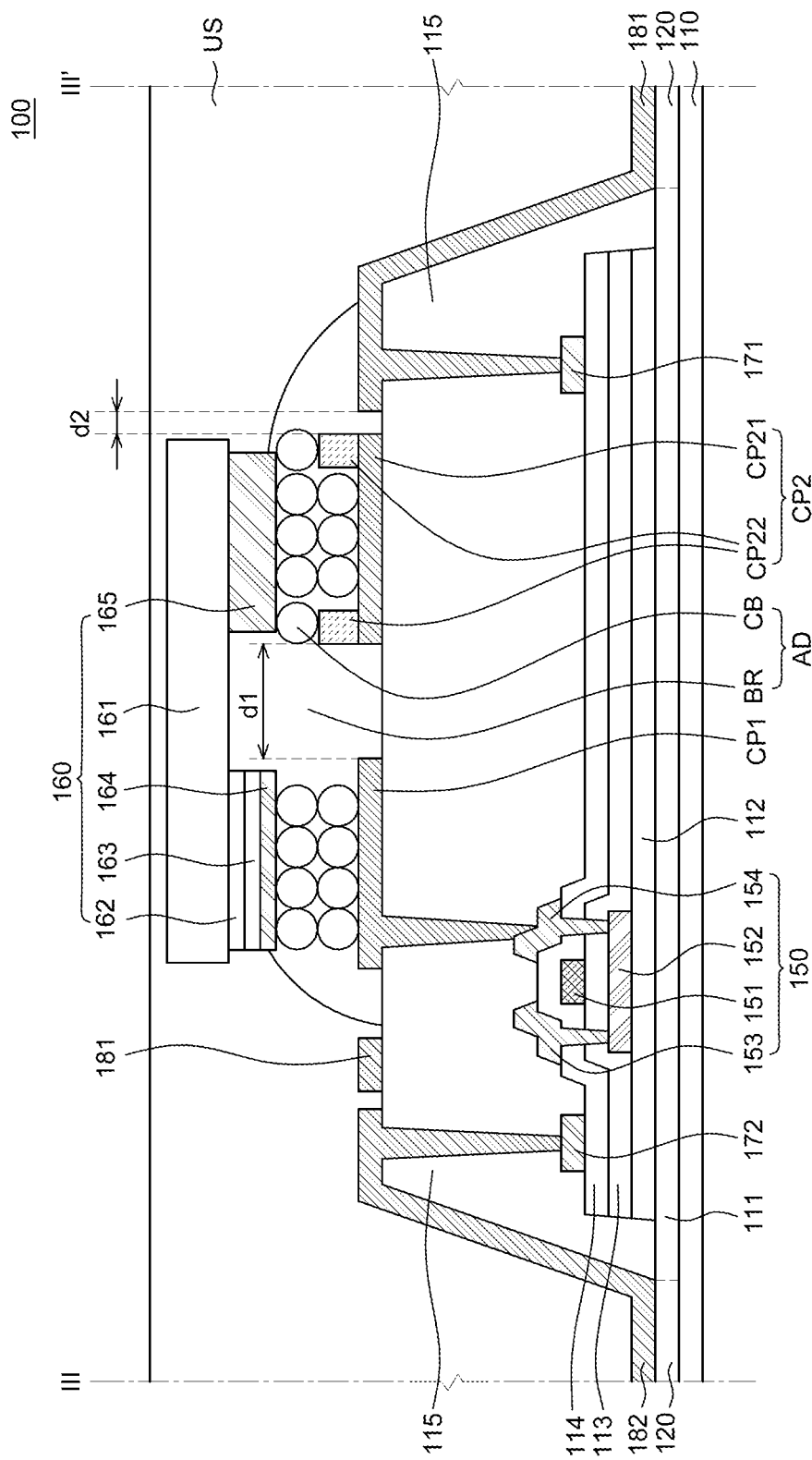
FIG. 3 is a cross-sectional view as taken along a line III-III' of FIG. 2.

Referring to FIG. 2 and FIG. 3, the plurality of connection lines 181 and 182 on the plurality of connection members 120 has a shape corresponding to the plurality of connection members 120. That is, the plurality of connection lines 181 and 182 may have a sine wave shape. The plurality of connection lines 181 and 182 electrically connects the pads 171 and 172 disposed on the pixel substrates 111 adjacent to each other among the plurality of pixel substrates 111. Each of plurality of connection lines 181 and 182 is extended in a curved shape rather than a straight line between the pads 171 and 172. However, for example, as shown in FIG. 2, the shape of the plurality of connection lines 181 and 182 is not limited thereto. The plurality of connection lines 181 and 182 may have various shapes. For example, the plurality of connection lines 181 and 182 may be extended in a zigzag manner, or a plurality of diamond-shaped lines 181 and 182 may be extended by being connected to each other at their vertices.

Referring to FIG. 3, a plurality of inorganic insulating layers is disposed on the plurality of pixel substrates 111. For example, the plurality of inorganic insulating layers may include a buffer layer 112, a gate insulating layer 113 and an interlayer insulating layer 114. However, the present disclosure is not limited thereto. Various inorganic insulating layers may be further disposed on the plurality of pixel substrates 111. One or more of the buffer layer 112, the gate insulating layer 113 and the interlayer insulating layer 114 may be omitted.

Referring to FIG. 3, the buffer layer 112 is disposed on the plurality of pixel substrates 111. The buffer layer 112 is formed on the plurality of pixel substrates 111 to protect various components of the display device 100 against permeation of moisture ($H_2O$) and oxygen ($O_2$) from the outside of the lower substrate 110 and the plurality of pixel substrates 111. The buffer layer 112 may be made of an insulating material. For example, the buffer layer 112 may be formed as a single inorganic layer or a plurality of inorganic layers of silicon nitride (SiNx), silicon oxide (SiOx), silicon oxynitride (SiON) or the like. However, the buffer layer 112 may be omitted depending on the structure or characteristics of the display device 100.

In this case, the buffer layer 112 may be formed only in an area overlapping with the plurality of pixel substrates 111 and the plurality of non-pixel substrates 121. As described above, the buffer layer 112 may be made of an inorganic material. Thus, the buffer layer 112 may be easily damaged, such as easily cracked, while the display device 100 is stretched. Therefore, the buffer layer 112 may not be formed in areas between the plurality of pixel substrates 111 and the plurality of non-pixel substrates 121. The buffer layer 112 may be patterned into the shapes of the plurality of pixel substrates 111 and the plurality of non-pixel substrates 121 and formed only on upper portions of the plurality of pixel substrates 111 and the plurality of non-pixel substrates 121. Accordingly, in the display device 100 according to an embodiment of the present disclosure, the buffer layer 112 is formed only in the area overlapping with the plurality of pixel substrates 111 and the plurality of non-pixel substrates 121 which are rigid substrates. Thus, it is possible to suppress damage to the buffer layer 112 even when the display device 100 is deformed, such as bent or stretched.

Referring to FIG. 3, a transistor 150 including a gate electrode 151, an active layer 152, a source electrode 153 and a drain electrode 154 is formed on the buffer layer 112.

Referring to FIG. 3, the active layer 152 is disposed on the buffer layer 112. For example, the active layer 152 may be made of an oxide semiconductor. Alternatively, the active layer 152 may be made of amorphous silicon (a-Si), polycrystalline silicon (poly-Si), an organic semiconductor, or the like.

The gate insulating layer 113 is disposed on the active layer 152. The gate insulating layer 113 is configured to electrically insulate the gate electrode 151 from the active layer 152. Further, the gate insulating layer 113 may be made of an insulating material. For example, the gate insulating layer 113 may be formed as a single inorganic layer or a plurality of inorganic layers of silicon nitride (SiNx) or silicon oxide (SiOx), but is not limited thereto.

The gate electrode 151 is disposed on the gate insulating layer 113. The gate electrode 151 is disposed to overlap with the active layer 152. The gate electrode 151 may be made of any one of various metal materials, for example, molybdenum (Mo), aluminum (Al), chromium (Cr), gold (Au), titanium (Ti), nickel (Ni), neodymium (Nd) and copper (Cu). Alternatively, the gate electrode 151 may be made of an alloy of two or more of them, or a plurality of layer thereof, but is not limited thereto.

The interlayer insulating layer 114 is disposed on the gate electrode 151. The interlayer insulating layer 114 serves to insulate the gate electrode 151 from the source electrode 153 and the drain electrode 154. The interlayer insulating layer 114 may also be made of an inorganic material like the buffer layer 112. For example, the interlayer insulating layer 114 may be formed as a single inorganic layer or a plurality of inorganic layers of silicon nitride (SiNx) or silicon oxide (SiOx), but is not limited thereto.

The source electrode 153 and the drain electrode 154, each of which is in contact with the active layer 152, are disposed on the interlayer insulating layer 114. The source electrode 153 and the drain electrode 154 are disposed to be spaced apart from each other on the same layer. The source electrode 153 and the drain electrode 154 may be electrically connected to the active layer 152 to be in contact with the active layer 152. The source electrode 153 and the drain electrode 154 may be made of any one of various metal materials, for example, molybdenum (Mo), aluminum (Al), chromium (Cr), gold (Au), titanium (Ti), nickel (Ni), neodymium (Nd) and copper (Cu). Alternatively, the source electrode 153 and the drain electrode 154 may be made of an alloy of two or more of them, or a plurality of layers thereof, but are not limited thereto.

Also, the gate insulating layer 113 and the interlayer insulating layer 114 may be patterned and formed only in an area overlapping with the plurality of pixel substrates 111. The gate insulating layer 113 and the interlayer insulating layer 114 may also be made of an inorganic material like the buffer layer 112. Thus, the gate insulating layer 113 and the interlayer insulating layer 114 may be easily damaged, such as easily cracked, while the display device 100 is stretched. Therefore, the gate insulating layer 113 and the interlayer insulating layer 114 may not be formed in areas between the plurality of pixel substrates 111. The gate insulating layer 113 and the interlayer insulating layer 114 may be patterned into the shapes of the plurality of pixel substrates 111 and formed only on upper portions of the plurality of pixel substrates 111.

For the convenience of description, FIG. 3 illustrates only a driving transistor among various transistors which may be included in the display device 100. However, a switching transistor, a capacitor and the like may also be included in the display device 100. Further, in the present disclosure, the transistor 150 is described as having a coplanar structure, but various types of transistors having a staggered structure or the like may also be used.

Referring to FIG. 3, a power pad 171 among the plurality of pads 171 and 172 is disposed on the interlayer insulating layer 114. The power pad 171 serves to transmit a power signal to the plurality of sub-pixels SPX. The power signal may be transmitted from the power pad 171 to a pixel circuit through a line formed on the pixel substrate 111. The power pad 171 may be formed of the same material on the same layer as the source electrode 153 and the drain electrode 154, but is not limited thereto.

Referring to FIG. 3, a data pad 172 among the plurality of pads 171 and 172 is disposed on the interlayer insulating layer 114. The data pad 172 serves to transmit a data signal to the plurality of sub-pixels SPX. The data signal may be transmitted from the data pad 172 to the source electrode 153 or the drain electrode 154 through a data line formed on the pixel substrate 111. The data pad 172 may be formed of the same material on the same layer as the source electrode 153 and the drain electrode 154, but is not limited thereto.

Referring to FIG. 3, a planarization layer 115 is formed on the transistor 150 and the interlayer insulating layer 114. The planarization layer 115 serves to flatten an upper portion of the transistor 150. The planarization layer 115 may be formed as a single layer or a plurality of layers and may be made of an organic material. Thus, the planarization layer 115 may also be referred to as an organic insulating layer. For example, the planarization layer 115 may be made of an acrylic organic material, but is not limited thereto.

Referring to FIG. 3, the planarization layer 115 is disposed between the plurality of pixel substrates 111 and the first connection lines 181 so as to cover upper surfaces and side surfaces of the buffer layer 112, the gate insulating layer 113 and the interlayer insulating layer 114. Further, the planarization layer 115 surrounds the buffer layer 112, the gate insulating layer 113 and the interlayer insulating layer 114 together with the plurality of pixel substrates 111. Specifically, the planarization layer 115 may be disposed to cover an upper surface and a side surface of the interlayer insulating layer 114, a side surface of the gate insulating layer 113, a side surface of the buffer layer 112 and a part of upper surfaces of the plurality of pixel substrates 111. Thus, the planarization layer 115 between the plurality of pixel substrates 111 and the plurality of first connection lines 181 may compensate for steps between the side surfaces of the buffer layer 112, the gate insulating layer 113 and the interlayer insulating layer 114. Also, the planarization layer 115 may enhance adhesion strength between the planarization layer 115 and the first connection lines 181 disposed on a side surface of the planarization layer 115.

Meanwhile, an incline angle of the side surface of the planarization layer 115 may be smaller than those of the side surfaces of the buffer layer 112, the gate insulating layer 113 and the interlayer insulating layer 114. However, the present disclosure is not limited thereto.

In some embodiments, a passivation layer may be formed between the transistor 150 and the planarization layer 115. That is, the passivation layer covering the transistor 150 may be formed to protect the transistor 150 against permeation of moisture and oxygen. The passivation layer may be made of an inorganic material and formed as a single layer or a plurality of layers, but is not limited thereto.

Referring to FIG. 2 and FIG. 3, the connection lines 181 and 182 refer to lines that electrically connect the pads 171 and 172 disposed on the plurality of pixel substrates 111 or the plurality of non-pixel substrates 121. The connection lines 181 and 182 are disposed on the pixel substrates 111 and the plurality of connection members 120.

The connection lines 181 and 182 include the first connection lines 181 and the second connection lines 182. The first connection lines 181 and the second connection lines 182 are disposed on the plurality of pixel substrates 111 and the plurality of connection members 120. Specifically, the first connection lines 181 refer to lines disposed on the connection members 120 extended in an X-axis direction, which is a first direction, among the plurality of connection members 120 and the plurality of pixel substrates 111. The second connection lines 182 refer to lines disposed on the connection members 120 extended in a Y-axis direction, which is a second direction, among the plurality of connection members 120 and the plurality of pixel substrates 111. The connection lines 181 and 182 may be made of a metal material such as copper (Cu), aluminum (Al), titanium (Ti) or molybdenum (Mo). Otherwise, the connection lines 181 and 182 may have a laminated structure of metal materials such as copper/molybdenum-titanium (Cu/MoTi), titanium/aluminum/titanium (Ti/Al/Ti) or the like, but are not limited thereto.

Referring to FIG. 1 and FIG. 2, the first connection lines 181 may connect pads on two pixel substrates 111 disposed side by side among the pads on the plurality of pixel substrates 111 disposed adjacent to each other in the X-axis direction. Each first connection line 181 may serve as a gate line, a light emission signal line, a high-potential power line, or a low-potential power line, but is not limited thereto. For example, the first connection lines 181 may serve as power lines for transmitting a high-potential voltage among power voltages as shown in FIG. 3. Also, the first connection lines 181 may electrically connect the power pads 171 on the two pixel substrates 111 disposed side by side in the X-axis direction.

Referring to FIG. 2, the second connection lines 182 may connect two pixel substrates 111 disposed side by side among the plurality of pixel substrates 111 disposed adjacent to each other in the Y-axis direction. Each second connection line 182 may serve as a data line, a high-potential power line, a low-potential power line, or a reference voltage line, but is not limited thereto. For example, the second connection lines 182 may serve as data lines and may electrically connect the data lines on the two pixel substrates 111 disposed side by side in the Y-axis direction.

Referring to FIG. 1, the connection lines 181 and 182 may further include lines that connect the pads on the plurality of pixel substrates 111 and the plurality of non-pixel substrates 121 or connect pads on two non-pixel substrates 121 disposed side by side among the pads on the plurality of non-pixel substrates 121 disposed adjacent to each other in the Y-axis direction.

Each first connection line 181 may be in contact with an upper surface and the side surface of the planarization layer 115 disposed on the pixel substrate 111 and may be extended to an upper surface of the connection member 120. Also, each second connection line 182 may be extended from the pixel substrate 111 to the connection member 120 and an upper surface of an inorganic insulating layer.

Referring to FIG. 3, an individual connection pad CP1 and a common connection pad CP2 are disposed on the planarization layer 115. The individual connection pad CP1 and the common connection pad CP2 serve to transmit signals to a plurality of light emitting diodes (LEDs) 160.

Referring to FIG. 2 and FIG. 3, a plurality of individual connection pads CP1 is disposed on the planarization layer 115. The plurality of individual connection pads CP1 may be connected to the transistor 150 and may transmit voltages to the plurality of LEDs 160. Thus, the plurality of individual connection pads CP1 may serve as an anode.

The plurality of individual connection pads CP1 may be formed on the planarization layer 115 through the same process as the connection lines 181 and 182. That is, the plurality of individual connection pads CP1 may be formed of the same material and disposed on the same layer as the connection lines 181 and 182, but is not limited thereto.

The number of the plurality of individual connection pads CP1 disposed on one pixel substrate 111 may be equal to the number of the plurality of LEDs 160 disposed on one pixel substrate 111. For example, if three LEDs 160 are disposed on a pixel substrate 111 as shown in FIG. 2, three individual connection pads CP1 may be disposed on one pixel substrate 111 to apply a separate voltage to each of the LEDs 160.

Referring to FIG. 2 and FIG. 3, the common connection pad CP2 is disposed on the planarization layer 115. The common connection pad CP2 may be connected to the first connection line 181 and may transmit a voltage to the plurality of LEDs 160. Thus, the common connection pad CP2 may serve as a cathode.

The number of common connection pads CP2 disposed on one pixel substrate 111 may be one regardless of the number of the plurality of LEDs 160 disposed on one pixel substrate 111. For example, if three LEDs 160 are disposed on one pixel substrate 111 as shown in FIG. 2, the common connection pad CP2 just needs to equally apply low-potential power to the three LEDs 160. Thus, a single common connection pad CP2 may be disposed on one pixel substrate 111 and may be electrically connected to the three LEDs 160.

A distance d1 between the individual connection pad CP1 and the common connection pad CP2 may be determined based on a distance between an n-electrode 165 and a p-electrode 164 of the LED 160. The p-electrode 164 of the LED 160 needs to be electrically connected to the individual connection pad CP1, and the n-electrode 165 of the LED 160 needs to be electrically connected to the common connection pad CP2. Any one of the n-electrode 165 and the p-electrode 164 of the LED 160 should not be electrically connected to both the individual connection pad CP1 and the common connection pad CP2. Thus, the distance d1 between the individual connection pad CP1 and the common connection pad CP2 may be determined in consideration of the distance between the n-electrode 165 and the p-electrode 164 in the LED 160.

A distance d2 between the first connection line 181 that is adjacent to the common connection pad CP2 and transmits a high-potential voltage and the common connection pad CP2 may be set to be reduced or minimized. Referring to FIG. 2 and FIG. 3, the first connection line 181 that transmits a high-potential voltage may be disposed on the planarization layer 115 on the lower side of the common connection pad CP2 in the Y-axis direction. As the display device 100 is developed to have high resolution, it is beneficial for the size of each pixel substrate 111 to be reduced or minimized. Thus, it is beneficial for a distance between components disposed on the pixel substrate 111 also to be reduced or minimized in consideration of a process margin or the like. Accordingly, the distance d2 between the first connection line 181 that is adjacent to the common connection pad CP2 and transmits a high-potential voltage and the common connection pad CP2 may be designed to a minimum in consideration of a process margin.

Meanwhile, although not illustrated in FIG. 3, a bank may be disposed on the individual connection pad CP1, the common connection pad CP2, the connection lines 181 and 182 and the planarization layer 115. The bank may serve to distinguish the sub-pixels SPX adjacent from each other.

Referring to FIG. 3, the LED 160 is disposed on the individual connection pad CP1 and the common connection pad CP2. The LED 160 includes an n-type layer 161, an active layer 162, a p-type layer 163, the n-electrode 165 and the p-electrode 164. The LED 160 of the display device 100 according to an embodiment of the present disclosure has a flip-chip structure in which the n-electrode 165 and the p-electrode 164 are formed on one surface thereof.

The n-type layer 161 may be formed by injecting n-type impurities into gallium nitride (GaN) having excellent crystallinity. The n-type layer 161 may be disposed on a separate base substrate which is made of a light emitting material.

The active layer 162 is disposed on the n-type layer 161. The active layer 162 is a light emitting layer that emits light in the LED 160 and may be made of a nitride semiconductor, for example, indium gallium nitride (InGaN). The p-type layer 163 is disposed on the active layer 162. The p-type layer 163 may be formed by injecting p-type impurities into gallium nitride (GaN).

As described above, the LED 160 according to an embodiment of the present disclosure is manufactured by sequentially laminating the n-type layer 161, the active layer 162, and the p-type layer 163, and then, etching a predetermined area of the layers to thereby form the n-electrode 165 and the p-electrode 164. In this case, the predetermined area is a space to separate the n-electrode 165 and the p-electrode 164 from each other and is etched to expose a part of the n-type layer 161. In other words, a surface of the LED 160 on which the n-electrode 165 and the p-electrode 164 are to be disposed may not be even and may have different levels of height.

As described above, the n-electrode 165 is disposed on the etched area, e.g., on the n-type layer 161 exposed by etching. The n-electrode 165 may be made of a conductive material. Further, the p-electrode 164 is disposed on a non-etched area, e.g., on the p-type layer 163. The p-electrode 164 may also be made of a conductive material. For example, the p-electrode 164 may be made of the same material as the n-electrode 165.

An adhesive layer AD is disposed on upper surfaces of the individual connection pad CP1 and the common connection pad CP2 and between the individual connection pad CP1 and the common connection pad CP2. Thus, the LED 160 may be bonded onto the individual connection pad CP1 and the common connection pad CP2. In this case, the n-electrode 165 may be disposed on the common connection pad CP2 and the p-electrode 164 may be disposed on the individual connection pad CP1.

The adhesive layer AD may be a conductive adhesive layer formed by dispersing conductive balls CB in a base member BR. Thus, when heat or pressure is applied to the adhesive layer AD, the conductive balls CB are electrically connected to have conductive properties in a portion of the adhesive layer AD to which heat or pressure is applied.

The conductive balls CB mixed in the base member BR may serve to electrically connect an electrode of the LED 160 to the common connection pad CP2 and the individual connection pad CP1 when the electrode of the LED 160 is bonded to the common connection pad CP2 and the individual connection pad CP1. The conductive balls CB may be made of a conductive metal, such as gold (Au), having ductility inside a material, such as nickel (Ni), but is not limited thereto. Also, the conductive balls CB may have a diameter of about 4 μm before bonding, but the present disclosure is not limited thereto. When the electrode of the LED 160 is bonded to the connection pads, the material covering the inner conductive metal may be damaged by heat and pressure and the inner conductive metal may be cooled down and hardened. Thus, the electrode of the LED 160 may be electrically connected to the connection pads.

The base member BR may be an adhesive member having adhesiveness and insulating properties. The base member BR may be, for example, a thermosetting adhesive, but is not limited thereto.

Referring to FIG. 3, for example, the n-electrode 165 is electrically connected to the common connection pad CP2 through the adhesive layer AD. Also, the p-electrode 164 is electrically connected to the individual connection pad CP1 through the adhesive layer AD. The adhesive layer AD with the conductive balls CB mixed therein may be applied to upper surfaces of the individual connection pad CP1 and the common connection pad CP2 by an inkjet method or the like. Then, the LED 160 may be transferred onto the adhesive layer AD. Thereafter, the LED 160 may be pressed and heated to thereby electrically bond and connect the individual connection pad CP1 to the p-electrode 164 and the common connection pad CP2 to the n-electrode 165 through the conductive balls CB. Here, the conductive balls CB may be guided to be disposed only between the n-electrode 165 and the common connection pad CP2 and between the p-electrode 164 and the individual connection pad CP1. Meanwhile, other portions of the adhesive layer AD excluding a portion of the adhesive layer AD between the n-electrode 165 and the common connection pad CP2 and a portion where the conductive balls CB of the adhesive layer AD are disposed between the p-electrode 164 and the individual connection pad CP1 have insulating properties. Meanwhile, the adhesive layer AD may also be separately disposed on each of the individual connection pad CP1 and the common connection pad CP2.

As described above, the display device 100 according to an embodiment of the present disclosure has a structure in which the LED 160 is disposed on the lower substrate 110 on which the transistor 150 has been disposed. Thus, when the display device 100 is turned on, different levels of voltages applied to each of the individual connection pad CP1 and the common connection pad CP2 are transmitted to the n-electrode 165 and the p-electrode 164, respectively. Accordingly, the LED 160 emits light.

Referring to FIG. 3, an upper substrate US is disposed on the LED 160 and the lower substrate 110.

The upper substrate US serves to support various components disposed under the upper substrate US. Specifically, the upper substrate US may be formed by coating and hardening a material of the upper substrate US on the lower substrate 110 and the pixel substrate 111. Thus, the upper substrate US may be disposed to be in contact with the lower substrate 110, the pixel substrate 111, the connection member 120 and the connection lines 181 and 182.

The upper substrate US is a ductile substrate and may be made of a bendable or stretchable insulating material. The upper substrate US is a ductile substrate and may be reversibly expandable and contractible. Also, the upper substrate US may have an elastic modulus in the range of several to hundreds of MPa. Further, the upper substrate US may have a ductile breaking rate of 100% or more. The upper substrate US may have a thickness of 10 µm to 1 mm, but is not limited thereto.

The upper substrate US may be made of the same material as the lower substrate 110. For example, the upper substrate US may be made of silicone rubber such as polydimethylsiloxane (PDMS) and an elastomer such as polyurethane (PU), and polytetrafluoroethylene (PTFE). Thus, the upper substrate US may have flexibility. However, a material of the upper substrate US is not limited thereto.

Meanwhile, although not shown in FIG. 3, a polarizing layer may also be disposed on the upper substrate US. The polarizing layer may serve to polarize light incident from the outside of the display device 100 and reduce reflection of external light. Further, instead of the polarizing layer, other optical films or the like may be disposed on the upper substrate US.

Hereinafter, the common connection pad CP2 will be described in more detail with reference to FIG. 4 as well as FIG. 1 to FIG. 3.

Multilayer Structure of Common Connection Pad

Figure 4:
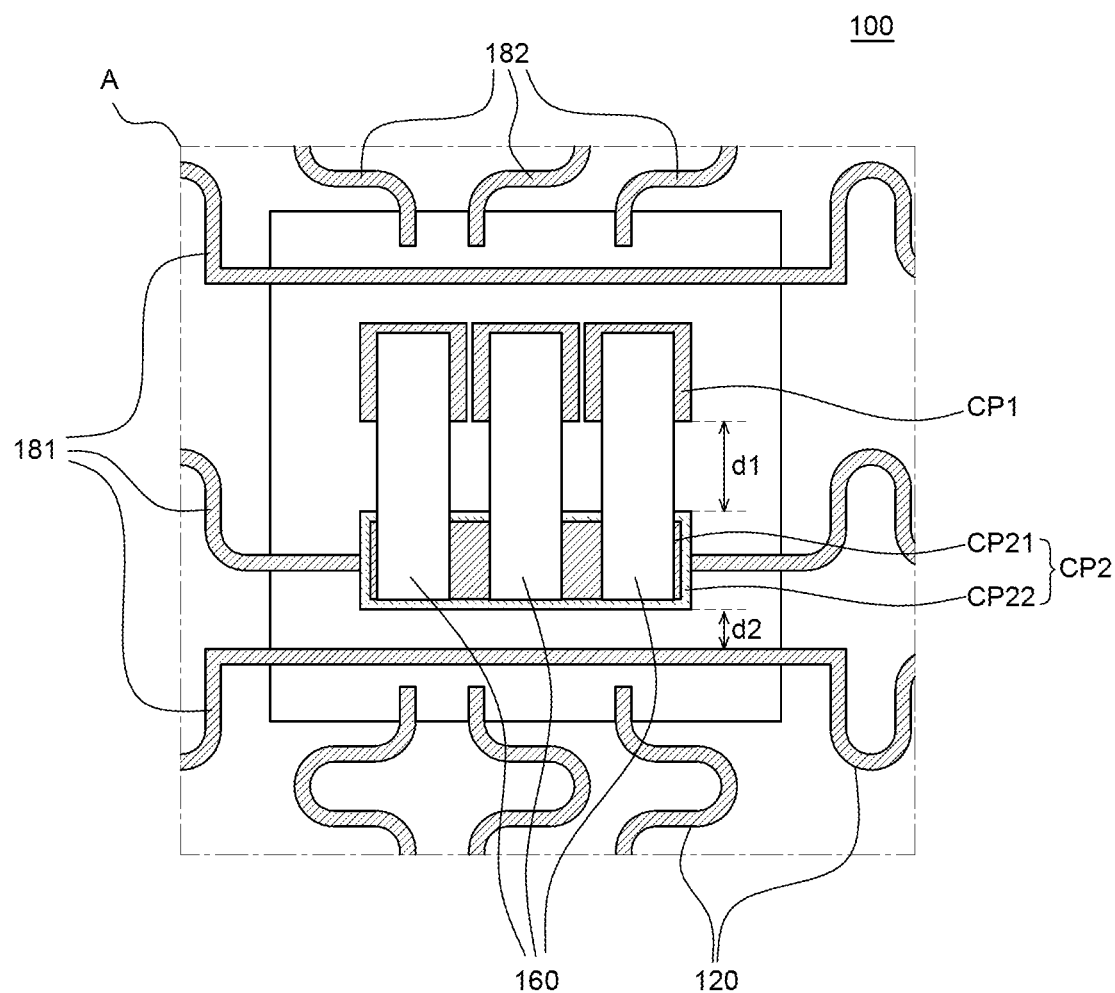
FIG. 4 is a schematic enlarged plan view of one pixel substrate of the display device according to an embodiment of the present disclosure.

FIG. 4 is a schematic enlarged plan view of a pixel substrate of the display device according to an embodiment of the present disclosure.

Referring to FIG. 3 and FIG. 4, the common connection pad CP2 includes a lower common connection pad CP21 and an upper common connection pad CP22. That is, the common connection pad CP2 may have a multilayer structure.

The lower common connection pad CP21 of the common connection pad CP2 is disposed on the planarization layer 115. The lower common connection pad CP21 may be electrically connected to the first connection line 181 and the plurality of LEDs 160.

The lower common connection pad CP21 may be formed through the same process as the first connection line 181. That is, the lower common connection pad CP21 may be formed of the same material on the same layer as the first connection line 181, but is not limited thereto. Here, the lower common connection pad CP21 may be formed integrally with a first connection line 181 for transmitting low-potential power among the first connection lines 181. However, it is beneficial for the plurality of LEDs 160 to be disposed on the lower common connection pad CP21 and electrically connected. Therefore, the common connection pad CP2 may have a greater width than the first connection line 181. The lower common connection pad CP21 may be made of, for example, copper (Cu) or the like, but is not limited thereto. A material of the lower common connection pad CP21 may vary depending on the design. Here, the lower common connection pad CP21 may have a thickness of from about 3000 Å to about 10000 Å, but is not limited thereto.

The upper common connection pad CP22 of the common connection pad CP2 is disposed on the lower common connection pad CP21. Here, the upper common connection pad CP22 may be disposed on an edge of the lower common connection pad CP21. That is, as shown in FIG. 4, the upper common connection pad CP22 may be disposed in a closed curve on the edge of the lower common connection pad CP21. However, the present disclosure is not limited thereto. The upper common connection pad CP22 may also be disposed in a plurality of patterns on the edge of the lower common connection pad CP21. Although FIG. 4 illustrates that the upper common connection pad CP22 has a rectangular cross-sectional shape, the cross-sectional shape of the upper common connection pad CP22 is not limited thereto.

The upper common connection pad CP22 may be made of a different material from the lower common connection pad CP21. Here, the upper common connection pad CP22 may be made of a material whose adhesiveness to electrodes of the plurality of LEDs 160 is higher than its adhesiveness to the lower common connection pad CP21. Thus, the upper common connection pad CP22 may be easily separated from the lower common connection pad CP21 during a process of repairing the plurality of LEDs 160.

For example, if the lower common connection pad CP21 is made of copper (Cu) and the electrodes of the plurality of LEDs 160 are made of gold (Au), the upper common connection pad CP22 may be made of gold (Au). That is, a material of the upper common connection pad CP22 may be different from a material of the lower common connection pad CP21 and may be the same as a material of the electrodes of the plurality of LEDs 160. Accordingly, due to a high adhesiveness between the homogeneous materials, the upper common connection pad CP22 may have a higher adhesiveness to the electrodes of the plurality of LEDs 160 than the lower common connection pad CP21. The upper common connection pad CP22 may be made of, for example, gold (Au), titanium (Ti), aluminum (Al) or molybdenum (Mo), but is not limited thereto. Here, the upper common connection pad CP22 may have a thickness of about 20000 Å, but is not limited thereto.

While the display device 100 is manufactured, if misalignment occurs during a transfer process for electrically connecting and bonding the individual connection pad CP1 and the common connection pad CP2 to the plurality of LEDs 160, a repair process for removing a misaligned LED 160 and transferring and bonding a new LED 160 may be added. Here, if the adhesiveness between the common connection pad CP2 bonded to the plurality of LEDs 160 and the electrodes of the plurality of LEDs 160 is too high, the common connection pad CP2 may be torn off from the lower substrate 110 together with the plurality of LEDs 160 while the LED 160 is removed. That is, the common connection pad CP2 is removed with a misaligned LED 160 as described above. In this case, even if a new LED 160 is transferred, it cannot be driven since it was not properly bonded. Therefore, the entire display device 100 becomes defective.

Accordingly, in the display device 100 according to an embodiment of the present disclosure, the common connection pad CP2 has a multilayer structure including the lower common connection pad CP21 and the upper common connection pad CP22. Thus, during a repair process, the plurality of LEDs 160 may be easily removed from the common connection pad CP2. Specifically, the upper common connection pad CP22 made of a material whose adhesiveness to electrodes of the plurality of LEDs 160 is higher than its adhesiveness to the lower common connection pad CP21 is disposed on the lower common connection pad CP21. Therefore, during a repair process, the upper common connection pad CP22 may be easily separated from the lower common connection pad CP21 together with the plurality of LEDs 160. Also, in some processes, all the upper common connection pad CP22 and the lower common connection pad CP21 may be disposed on the side of the lower substrate 110 and only the LEDs 160 may be separated. Thus, in the display device 100 according to an embodiment of the present disclosure, when a misaligned LED 160 is repaired, tearing-off of the common connection pad CP2 with the LED 160 from the lower substrate 110 may be reduced or minimized.

Also, while the display device 100 is manufactured, the adhesive layer AD for bonding and electrically connecting the plurality of LEDs 160 to the individual connection pad CP1 and the common connection pad CP2 at the same time is used during the transfer process for electrically connecting the individual connection pad CP1 and the common connection pad CP2 to the plurality of LEDs 160, and thus bonding the LED 160 to the pad. The adhesive layer AD may be formed in a liquid state on the individual connection pad CP1 and the common connection pad CP2 and then hardened by heat and/or pressure. Thus, while the adhesive layer AD is in a liquid state, the plurality of LEDs 160 may be moved along with movement of the adhesive layer AD. Therefore, misalignment of the plurality of LEDs 160 in relation to the individual connection pad CP1 and the common connection pad CP2 may occur. Also, when the adhesive layer AD is moved, an LED 160 may be misaligned between the common connection pad CP2 having a relatively small distance and the first connection line 181 for transmitting a high-potential voltage. Thus, the common connection pad CP2 and the first connection line 181 may be electrically connected by the electrode of the LED 160. In this case, a dark spot may occur in a sub-pixel SPX including the LED 160.

Accordingly, in the display device 100 according to an embodiment of the present disclosure, the common connection pad CP2 has a multilayer structure including the lower common connection pad CP21 and the upper common connection pad CP22. Thus, it is possible to reduce or minimize misalignment of an LED 160 caused by movement of the adhesive layer AD. Specifically, the upper common connection pad CP22 may be disposed on the edge of the lower common connection pad CP21 along the edge of the lower common connection pad CP21, and the common connection pad CP2 may have a step difference. Therefore, even if the adhesive layer AD is moved, movement of the conductive balls CB in the adhesive layer AD and the electrodes of the LEDs 160 may be restricted by the upper common connection pad CP22. Accordingly, in the display device 100 according to an embodiment of the present disclosure, the common connection pad CP2 having a step structure may be used to suppress the occurrence of misalignment of the LEDs 160 and the occurrence of a dark spot caused by misalignment.

Multilayer Structure of Individual Connection Pad

Figure 5A:
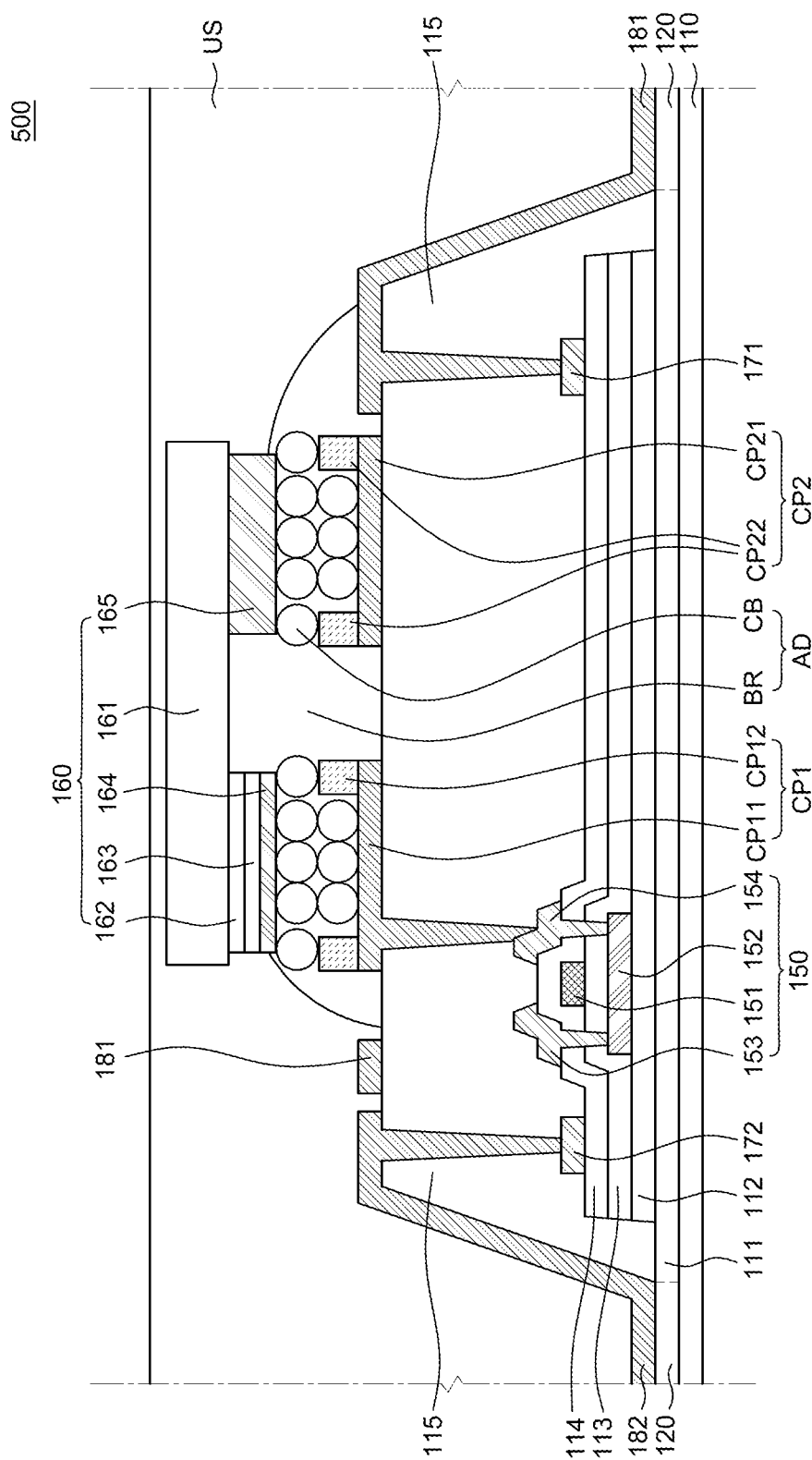
FIG. 5A is a schematic cross-sectional view of one pixel substrate of a display device according to another embodiment of the present disclosure.
Figure 5B:
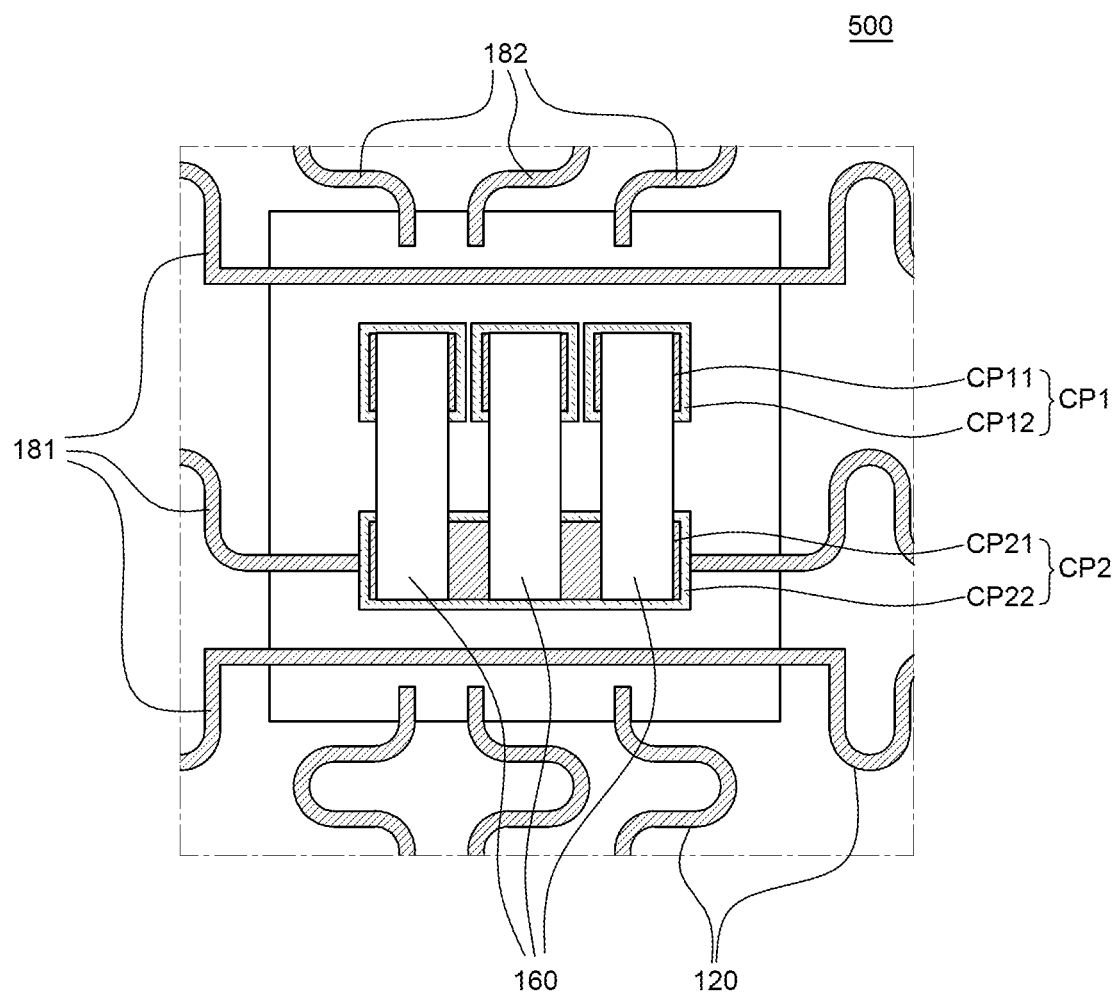
FIG. 5B is an enlarged plan view of one pixel substrate of the display device according to another embodiment of the present disclosure.

FIG. 5A is a schematic cross-sectional view of one pixel substrate of a display device according to another embodiment of the present disclosure. FIG. 5B is an enlarged plan view of one pixel substrate of the display device according to another embodiment of the present disclosure. A display device 500 shown in FIG. 5A and FIG. 5B is substantially the same as the display device 100 shown in FIG. 1 through FIG. 4 except for the individual connection pad CP1. Thus, a redundant description thereof will be omitted.

Referring to FIG. 5A and FIG. 5B, the individual connection pad CP1 of the display device 500 according to another embodiment of the present disclosure includes a plurality of lower individual connection pads CP11 and a plurality of upper individual connection pads CP12. An upper individual connection pad CP12 may be disposed on a lower individual connection pad CP11. Also, the upper individual connection pad CP12 may be formed in a shape corresponding to the upper common connection pad CP22 and disposed on the lower individual connection pad CP11. Thus, the upper individual connection pad CP12 may be disposed on an edge of the lower individual connection pad CP11, and the plurality of upper individual connection pads CP12 may be in partial contact with the electrodes of the plurality of LEDs 160.

In the multilayer structure of the individual connection pad CP1, the plurality of lower individual connection pads CP11 is disposed on the planarization layer 115. The plurality of lower individual connection pads CP11 may be electrically connected to the first connection line 181 and the plurality of LEDs 160.

The plurality of lower individual connection pads CP11 may be formed through the same process as the lower common connection pad CP21. That is, the plurality of lower individual connection pads CP11 may be formed of the same material on the same layer as the lower common connection pad CP21, but is not limited thereto. The plurality of lower individual connection pads CP11 may be made of, for example, copper (Cu) or the like, but is not limited thereto. A material of the plurality of lower individual connection pads CP11 may vary depending on the design. Here, the plurality of lower individual connection pads CP11 may have a thickness of from about 3000 Å to about 10000 Å, but is not limited thereto.

The upper individual connection pad CP12 is disposed on the lower individual connection pad CP11. Here, the upper individual connection pad CP12 may be disposed on an edge of the lower individual connection pad CP11. That is, as shown in FIG. 5B, the upper individual connection pad CP12 may be disposed in a closed curve on the edge of the lower individual connection pad CP11. However, the present disclosure is not limited thereto. The upper individual connection pad CP12 may also be disposed in a plurality of patterns on the edge of the lower individual connection pad CP11. The upper individual connection pad CP12 with the plurality of patterns corresponding to those of the upper common connection pad CP22 may be disposed on the lower individual connection pad CP11.

The upper individual connection pad CP12 may be made of a different material from the lower individual connection pad CP11. Here, the upper individual connection pad CP12 may be made of a material whose adhesiveness to electrodes of the plurality of LEDs 160 is higher than its adhesiveness to the lower individual connection pad CP11. Thus, the upper individual connection pad CP12 may be easily separated from the lower individual connection pad CP11 during a process of repairing the plurality of LEDs 160.

For example, if the lower individual connection pad CP11 is made of copper (Cu) and the electrodes of the plurality of LEDs 160 are made of gold (Au), the upper individual connection pad CP12 may be made of gold (Au). That is, a material of the upper individual connection pad CP12 may be different from a material of the lower individual connection pad CP11 and may be the same as the electrodes of the plurality of LEDs 160. Accordingly, due to a high adhesiveness between the homogeneous materials, the upper individual connection pad CP12 may have a higher adhesiveness to the electrodes of the LEDs 160 than the lower individual connection pad CP11. The upper individual connection pad CP12 may be made of, for example, gold (Au), titanium (Ti), aluminum (Al) or molybdenum (Mo), but is not limited thereto. Here, the upper individual connection pad CP12 may have a thickness of about 20000 Å, but is not limited thereto.

In the display device 500 according to another embodiment of the present disclosure, the plurality of individual connection pads CP1 has a multilayer structure including the plurality of lower individual connection pads CP11 and the plurality of upper individual connection pads CP12. Thus, during a repair process, the plurality of LEDs 160 may be easily removed from the plurality of individual connection pads CP1. Specifically, the upper individual connection pad CP12 made of a material whose adhesiveness to electrodes of the plurality of LEDs 160 is higher than its adhesiveness to the lower individual connection pad CP11 is disposed on the lower individual connection pad CP11. Therefore, during a repair process, the upper individual connection pad CP12 may be easily separated from the lower individual connection pad CP11 together with the plurality of LEDs 160. Also, in some processes, all the plurality of upper individual connection pads CP12 and the plurality of lower individual connection pads CP11 may be disposed on the side of the lower substrate 110 and only the LEDs 160 may be separated. Thus, in the display device 500 according to another embodiment of the present disclosure, when a misaligned LED 160 is repaired, tearing-off of the individual connection pad CP1 with the LED 160 from the lower substrate 110 may be reduced or minimized.

Also, in the display device 500 according to another embodiment of the present disclosure, the plurality of individual connection pads CP1 has a multilayer structure including the plurality of lower individual connection pads CP11 and the plurality of upper individual connection pads CP12. Thus, it is possible to reduced or minimize misalignment of an LED 160 caused by movement of the adhesive layer AD. Specifically, the upper individual connection pad CP12 may be disposed on the edge of the lower individual connection pad CP11 along the edge of the lower individual connection pad CP11, and the individual connection pad CP1 may have a step difference. Therefore, even if the adhesive layer AD is moved, movement of the conductive balls CB in the adhesive layer AD and the electrodes of the LEDs 160 may be restricted by the plurality of upper individual connection pads CP12. Accordingly, in the display device 500 according to another embodiment of the present disclosure, the plurality of individual connection pads CP1 having a step structure may be used to suppress the occurrence of misalignment of the LEDs 160 and the occurrence of a dark spot caused by misalignment.

Pattern of Upper Common Connection Pad

Figure 6:
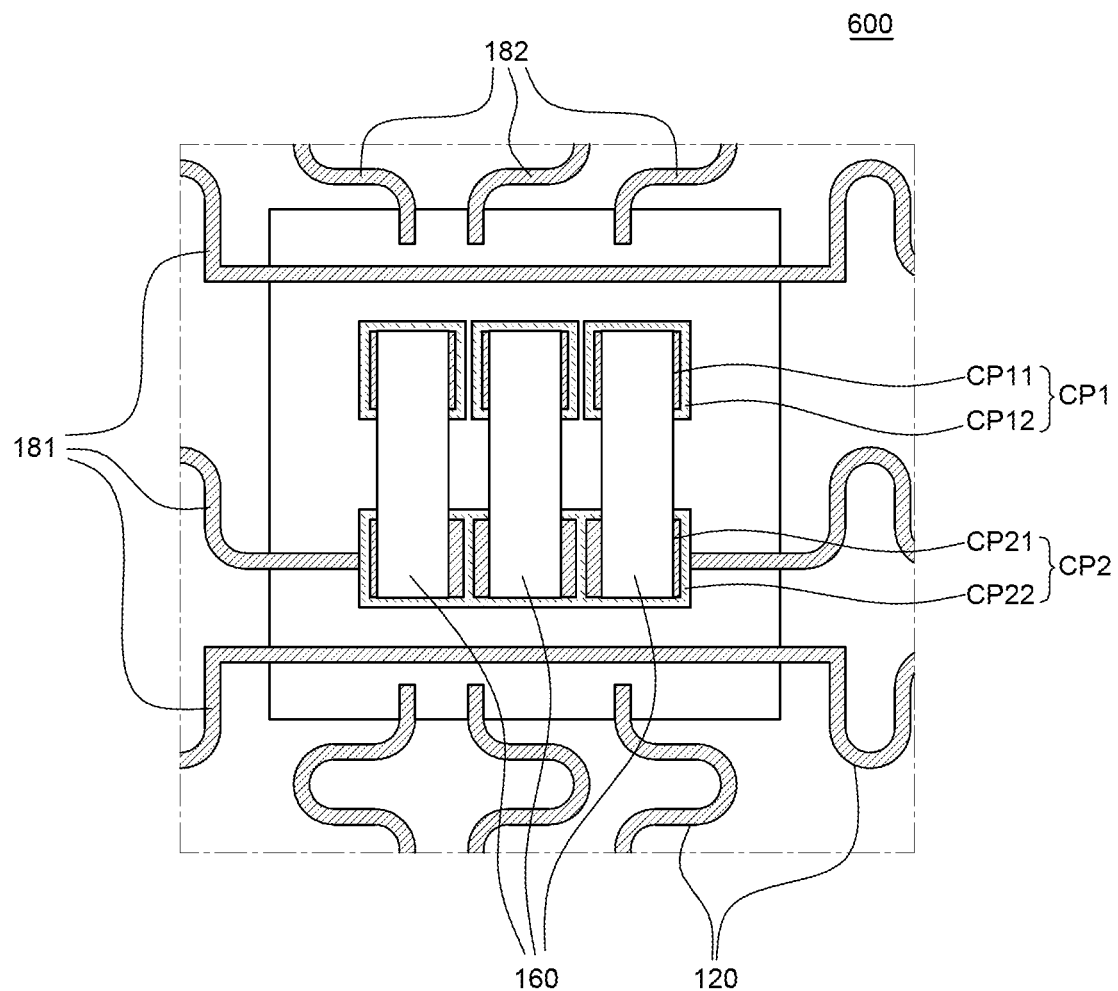
FIG. 6 is an enlarged plan view of one pixel substrate of a display device according to yet another embodiment of the present disclosure.

FIG. 6 is an enlarged plan view of one pixel substrate of a display device according to yet another embodiment of the present disclosure. A display device 600 shown in FIG. 6 is substantially the same as the display device 500 shown in FIG. 5A and FIG. 5B except for a shape of the upper common connection pad CP22. Thus, a redundant description thereof will be omitted.

Referring to FIG. 6, the upper common connection pad CP22 of the display device 600 according to yet another embodiment of the present disclosure may be further disposed on the lower common connection pad CP21 corresponding to a space between the plurality of individual connection pads CP1. Accordingly, the upper common connection pad CP22 may be further disposed in a space between the plurality of LEDs 160.

In the display device 600 according to yet another embodiment of the present disclosure, the upper common connection pad CP22 is further disposed on the lower common connection pad CP21 corresponding to the space between the plurality of individual connection pads CP1. Thus, a frictional force may be supplied to the electrodes of the plurality of LEDs 160. Accordingly, the electrodes of the plurality of LEDs 160 may not deviate from an area where the upper common connection pad CP22 is located. For example, even if the plurality of LEDs 160 slides in the left and right directions from the state shown in FIG. 6, they may be guided to move within an area defined by the upper common connection pad CP22. Thus, it is possible to suppress deviation of the plurality of LEDs 160 from the upper common connection pad CP22. Therefore, even if the adhesive layer AD is moved, movement of the conductive balls CB in the adhesive layer AD and the electrodes of the LEDs 160 may be restricted by the upper common connection pad CP22. Accordingly, in the display device 600 according to yet another embodiment of the present disclosure, the upper common connection pad CP22 is further disposed at a position corresponding to the space between the plurality of individual connection pads CP1. Thus, it is possible to suppress the occurrence of misalignment of the LEDs 160.

Figure 7:
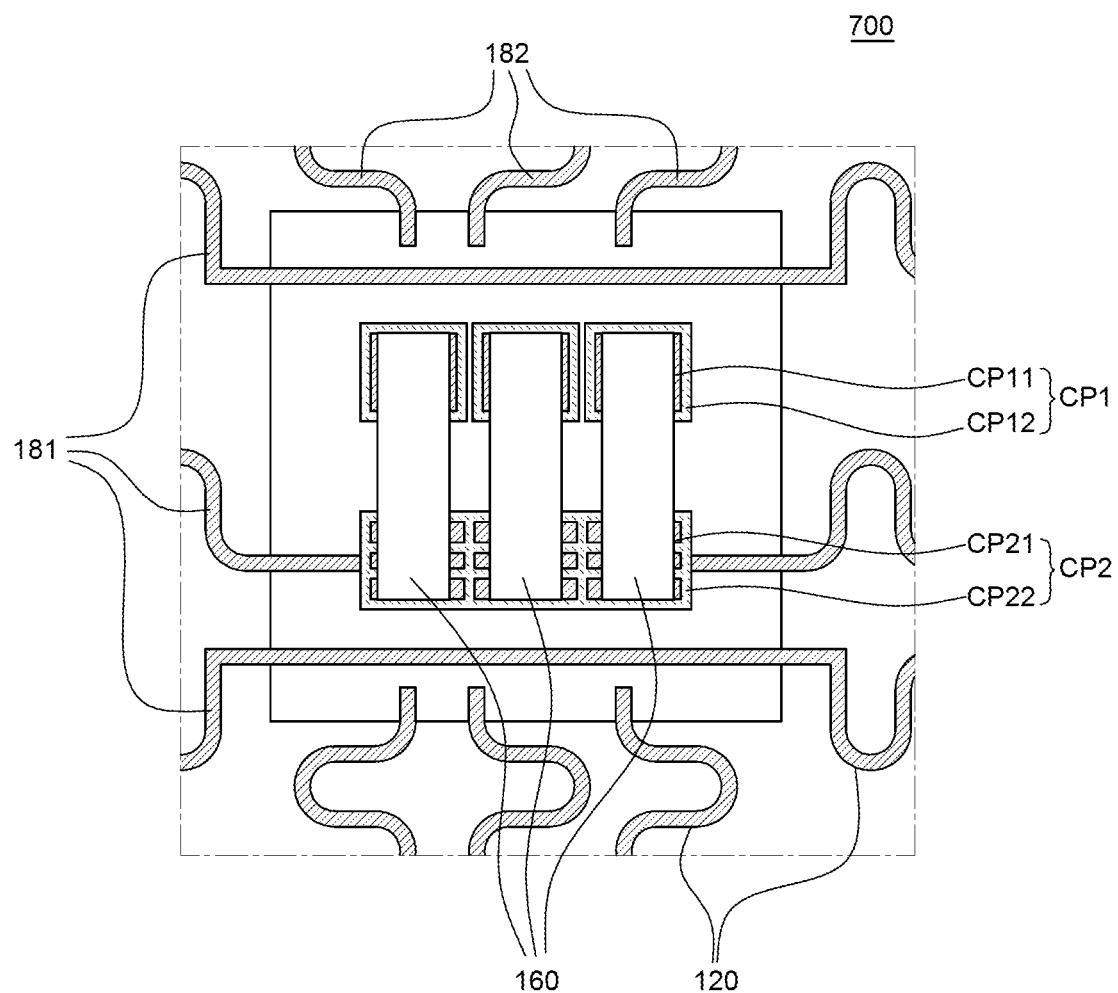
FIG. 7 is an enlarged plan view of one pixel substrate of a display device according to still another embodiment of the present disclosure.

FIG. 7 is an enlarged plan view of one pixel substrate of a display device 700 according to still another embodiment of the present disclosure. A display device 700 shown in FIG. 7 is substantially the same as the display device 600 shown in FIG. 6 except for a shape of the upper common connection pad CP22. Thus, a redundant description thereof will be omitted.

Referring to FIG. 7, the upper common connection pad CP22 of the display device 700 according to still another embodiment of the present disclosure may have a mesh form. That is, the upper common connection pad CP22 may be disposed in a mesh form on the lower common connection pad CP21. Here, the upper common connection pad CP22 may be extended on the lower common connection pad CP21 in a vertical direction and the left and right directions from the state shown in FIG. 7. For example, the upper common connection pad CP22 may include a portion disposed on the lower common connection pad CP21 to be parallel with the extension direction of the common connection pad CP2. Also, the upper common connection pad CP22 may include a portion disposed on the lower common connection pad CP21 to be perpendicular to the extension direction of the common connection pad CP2. The upper common connection pad CP22 of the display device 700 according to still another embodiment of the present disclosure is disposed in a mesh form on the lower common connection pad CP21. Thus, a greater frictional force may be supplied to the electrodes of the plurality of LEDs 160. Accordingly, the electrodes of the plurality of LEDs 160 may not deviate from an area where the upper common connection pad CP22 is located. For example, even if the plurality of LEDs 160 slides, the conductive balls CB may be caught in holes of a mesh pattern of the upper common connection pad CP22. Thus, the plurality of LEDs may be moved within an area defined by the upper common connection pad CP22, and it is possible to suppress deviation of the plurality of LEDs 160 from the common connection pad CP2. Therefore, even if the adhesive layer AD is moved, movement of the conductive balls CB in the adhesive layer AD and the electrodes of the LEDs 160 may be restricted by the upper common connection pad CP22. Accordingly, in the display device 700 according to still another embodiment of the present disclosure, the upper common connection pad CP22 is disposed in a mesh form on the lower common connection pad CP21. Thus, it is possible to suppress the occurrence of misalignment of the LEDs 160.

Insulating Layer

Figure 8:
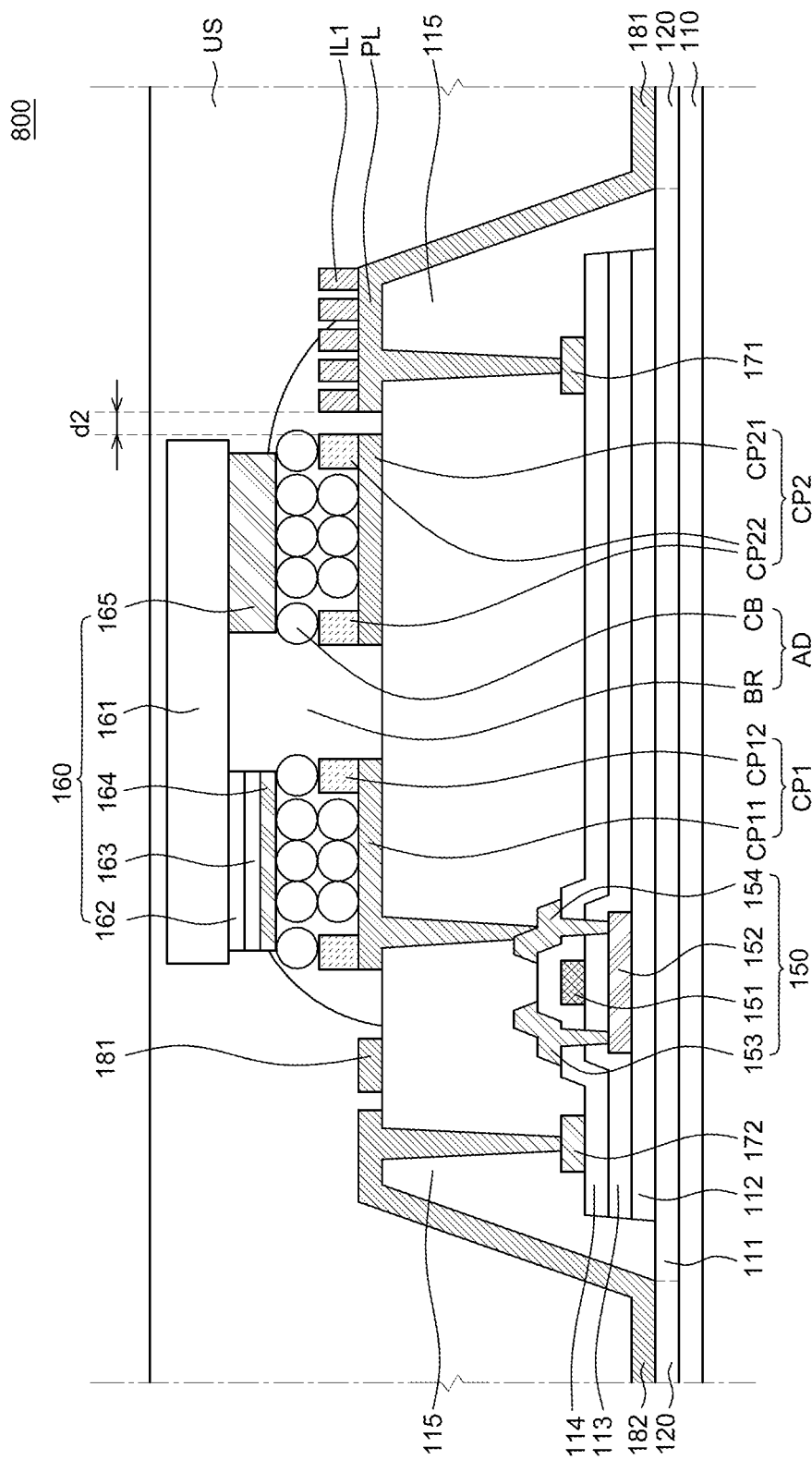
FIG. 8 is a schematic cross-sectional view of one pixel substrate of a display device according to still another embodiment of the present disclosure.

FIG. 8 is a schematic cross-sectional view of one pixel substrate of a display device according to still another embodiment of the present disclosure. A display device 800 shown in FIG. 8 is substantially the same as the display device 500 shown in FIG. 5A and FIG. 5B except for a placement of an insulating layer IL1. Thus, a redundant description thereof will be omitted.

Referring to FIG. 8, the display device 800 according to still another embodiment of the present disclosure may include the insulating layer IL1. The insulating layer IL1 may be disposed on the first connection line 181. Specifically, the insulating layer IL1 may be disposed on a power line PL for transmitting high-potential power among the first connection lines 181.

The insulating layer IL1 may be made of a material having insulating properties. The insulating layer IL1 may be an inorganic layer of, for example, silicon nitride (SiNx) or silicon oxide (SiOx), but is not limited thereto. A material of the insulating layer IL1 may vary depending on the design. Here, the insulating layer IL1 may have a thickness of from about 10000 Å to about 20000 Å, but is not limited thereto.

The insulating layer IL1 may include a plurality of insulating patterns. The plurality of insulating patterns of the insulating layer IL1 may have various shapes such as a pillar shape, a line shape, or a mesh shape.

The distance between the plurality of insulating patterns of the insulating layer IL1 may be smaller than the size of a conductive ball CB in the adhesive layer AD. For example, the distance between the plurality of insulating patterns of the insulating layer IL1 may be smaller than the radius or diameter of a conductive ball CB in the adhesive layer AD.

In the display device 800 according to still another embodiment of the present disclosure, the insulating layer IL1 including the plurality of insulating patterns is disposed on the first connection line 181 serving as a high-potential power line. Thus, it is possible to reduce or minimize the occurrence of misalignment of the LEDs 160. Specifically, if the LEDs 160 are moved toward the first connection line 181 for transmitting high-potential power by movement of the adhesive layer AD, an insulating pattern disposed most adjacent to the common connection pad CP2 among the plurality of insulating patterns may primarily suppress movement of the LEDs 160. Also, all the plurality of insulating patterns supply a frictional force when the LEDs 160 are moved on the insulating layer IL1 and thus may restrict movement of the LEDs 160. Accordingly, in the display device 800 according to still another embodiment of the present disclosure, it is possible to suppress the occurrence of misalignment of the LEDs 160 caused by movement of the adhesive layer AD.

Further, in the display device 800 according to still another embodiment of the present disclosure, the insulating layer IL1 is disposed on the first connection line 181 serving as a high-potential power line. Thus, even if the plurality of LEDs 160 is misaligned, it is possible to suppress connection of the LEDs 160 to the first connection line 181 serving as a power line for transmitting high-potential power. Even if the LEDs 160 are disposed on the first connection line 181 serving as a power line for transmitting high-potential power by movement of the adhesive layer AD, the LEDs 160 may not be connected to the first connection line 181 serving as a power line for transmitting high-potential power by the insulating layer IL1 disposed on the first connection line 181. Accordingly, in the display device 800 according to still another embodiment of the present disclosure, the insulating layer IL1 may be used to suppress the occurrence of a dark spot caused by connection of the LEDs 160 to both the common connection pad CP2 and the first connection line 181 serving as a power line for transmitting high-potential power.

Figure 9:
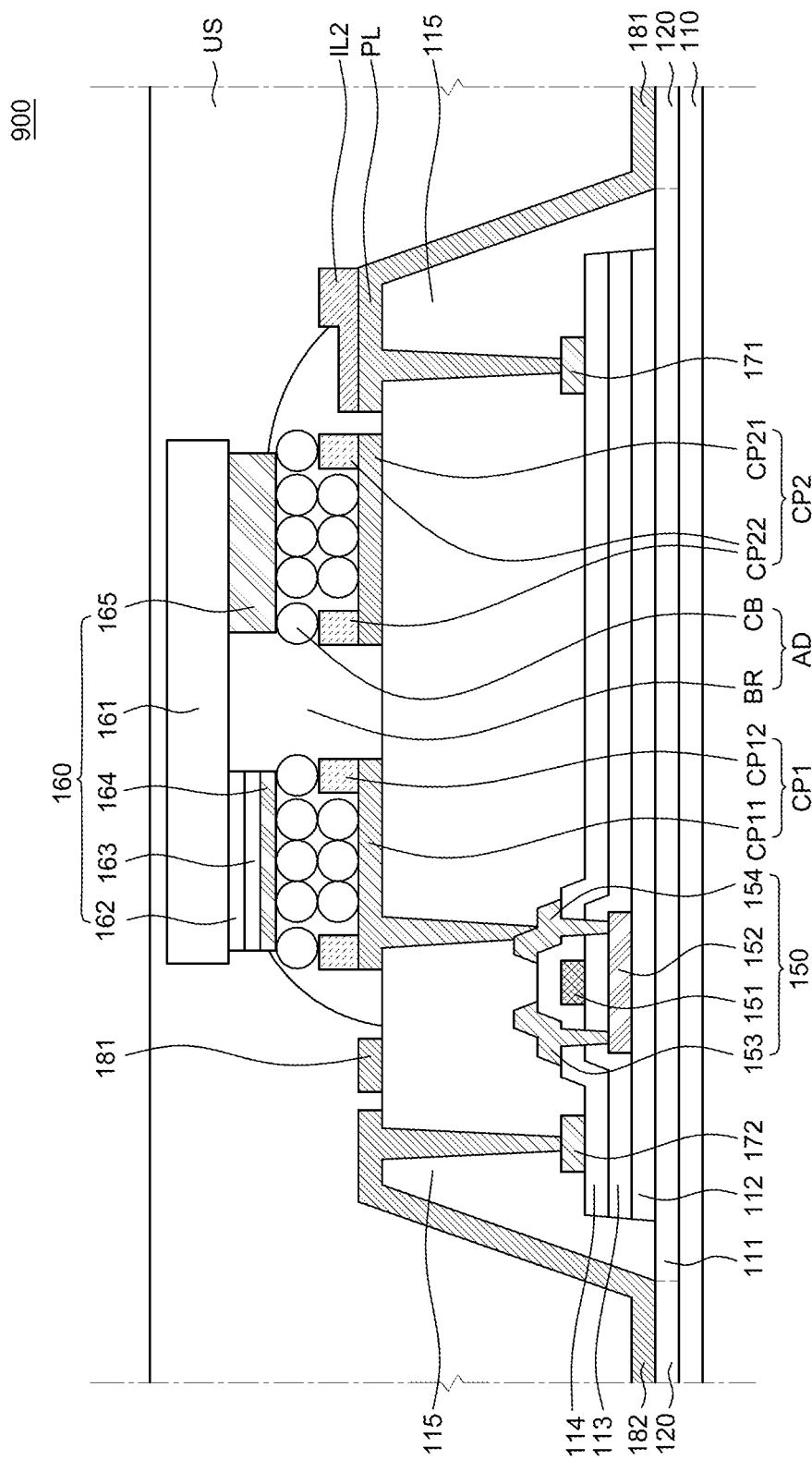
FIG. 9 is a schematic cross-sectional view of one pixel substrate of a display device according to still another embodiment of the present disclosure.

FIG. 9 is a schematic cross-sectional view of one pixel substrate of a display device according to still another embodiment of the present disclosure. A display device 900 shown in FIG. 9 is substantially the same as the display device 800 shown in FIG. 8 except for an insulating layer IL2. Thus, a redundant description thereof will be omitted.

Referring to FIG. 9, the display device 900 according to still another embodiment of the present disclosure may include the insulating layer IL2. The insulating layer IL2 may be disposed on the first connection line 181. Specifically, the insulating layer IL2 may be disposed on a power line PL for transmitting high-potential power among the first connection lines 181.

The insulating layer IL2 may have a stepped upper surface. That is, in the insulating layer IL2, a portion relatively adjacent to the common connection pad CP2 may have a smaller height than a portion relatively far from the common connection pad CP2. However, the present disclosure is not limited thereto. The insulating layer IL2 may have an inclined upper surface. In this case, the insulating layer IL2 may have an inclined upper surface whose height gradually increases as the distance from the common connection pad CP2 increases.

In the display device 900 according to still another embodiment of the present disclosure, the insulating layer IL2 is disposed on the first connection line 181 serving as a high-potential power line. Thus, it is possible to reduce or minimize the occurrence of misalignment of the LEDs 160. Specifically, if the LEDs 160 are moved toward the first connection line 181 for transmitting high-potential power by movement of the adhesive layer AD, a portion of the insulating layer IL2 which is relatively adjacent to the common connection pad CP2 may primarily suppress movement of the LEDs 160. Also, if the LEDs 160 are moved onto the portion of the insulating layer IL2 which is relatively adjacent to the common connection pad CP2, a portion of the insulating layer IL2 which is relatively far from the common connection pad CP2 and has a greater height may secondarily suppress movement of the LEDs 160. Accordingly, in the display device 900 according to still another embodiment of the present disclosure, it is possible to suppress the occurrence of misalignment of the LEDs 160 caused by movement of the adhesive layer AD.

Further, in the display device 900 according to still another embodiment of the present disclosure, the insulating layer IL2 is disposed on the first connection line 181 serving as a high-potential power line. Thus, even if the plurality of LEDs 160 is misaligned, it is possible to suppress connection of the LEDs 160 to the first connection line 181 serving as a power line for transmitting high-potential power. That is, even if the LEDs 160 are disposed on the first connection line 181 serving as a power line for transmitting high-potential power by movement of the adhesive layer AD, the LEDs 160 may not be connected to the first connection line 181 serving as a power line for transmitting high-potential power by the insulating layer IL2 disposed on the first connection line 181. Accordingly, it is possible to suppress the occurrence of a dark spot caused by connection of the LEDs 160 to both the common connection pad CP2 and the first connection line 181 serving as a power line for transmitting high-potential power.

Figure 10:
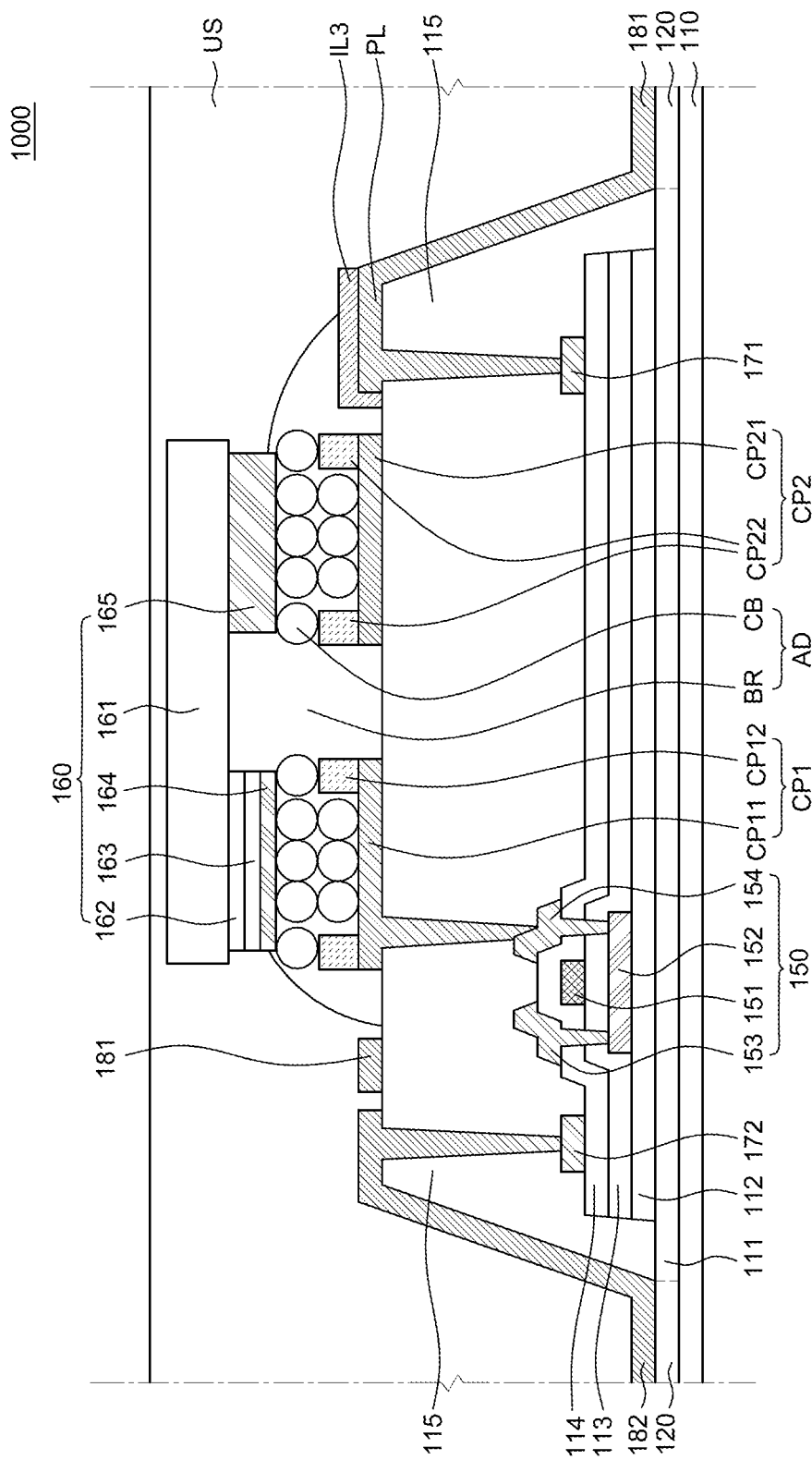
FIG. 10 is a schematic cross-sectional view of one pixel substrate of a display device according to still another embodiment of the present disclosure.

FIG. 10 is a schematic cross-sectional view of one pixel substrate of a display device according to still another embodiment of the present disclosure. A display device 1000 shown in FIG. 10 is substantially the same as the display device 800 shown in FIG. 8 except for an insulating layer IL3. Thus, a redundant description thereof will be omitted.

Referring to FIG. 10, the display device 1000 according to still another embodiment of the present disclosure may include the insulating layer IL3. The insulating layer IL3 may be disposed on the first connection line 181. Specifically, the insulating layer IL3 may be disposed on a power line for transmitting high-potential power among the first connection lines 181.

The insulating layer IL3 may be disposed to cover an upper surface and a side surface of the first connection line 181 serving as a power line for transmitting high-potential power. Specifically, the insulating layer IL3 may be disposed to cover the upper surface of the first connection line 181 serving as a power line for transmitting high-potential power and the side surface of the first connection line 181 adjacent to the common connection pad CP2. That is, the insulating layer IL3 may insulate the LEDs 160 from the upper surface and the side surface of the first connection line 181 serving as a power line for transmitting high-potential power.

In the display device 1000 according to still another embodiment of the present disclosure, the insulating layer IL3 is disposed on the upper surface and the side surface of the first connection line 181 serving as a high-potential power line. Thus, it is possible to reduce or minimize the occurrence of misalignment of the LEDs 160. Specifically, if the LEDs 160 are moved toward the first connection line 181 serving as a power line for transmitting high-potential power by movement of the adhesive layer AD, the insulating layer IL3 may suppress movement of the LEDs 160. Accordingly, in the display device 1000 according to still another embodiment of the present disclosure, it is possible to suppress the occurrence of misalignment of the LEDs 160 caused by movement of the adhesive layer AD.

Further, in the display device 1000 according to still another embodiment of the present disclosure, the insulating layer IL3 is disposed on the upper surface and the side surface of the first connection line 181 serving as a high-potential power line. Thus, even if the plurality of LEDs 160 is misaligned, it is possible to suppress connection of the LEDs 160 to the first connection line 181 serving as a power line for transmitting high-potential power. That is, even if the LEDs 160 are moved toward the first connection line 181 serving as a power line for transmitting high-potential power by movement of the adhesive layer AD, the LEDs 160 may not be connected to the first connection line 181 serving as a power line for transmitting high-potential power by the insulating layer IL3 disposed on the upper surface of the first connection line 181 and the side surface of the first connection line 181 adjacent to the common connection pad CP2. Accordingly, it is possible to suppress the occurrence of a dark spot caused by connection of the LEDs 160 to both the common connection pad CP2 and the first connection line 181 serving as a power line for transmitting high-potential power.

Figure 11:
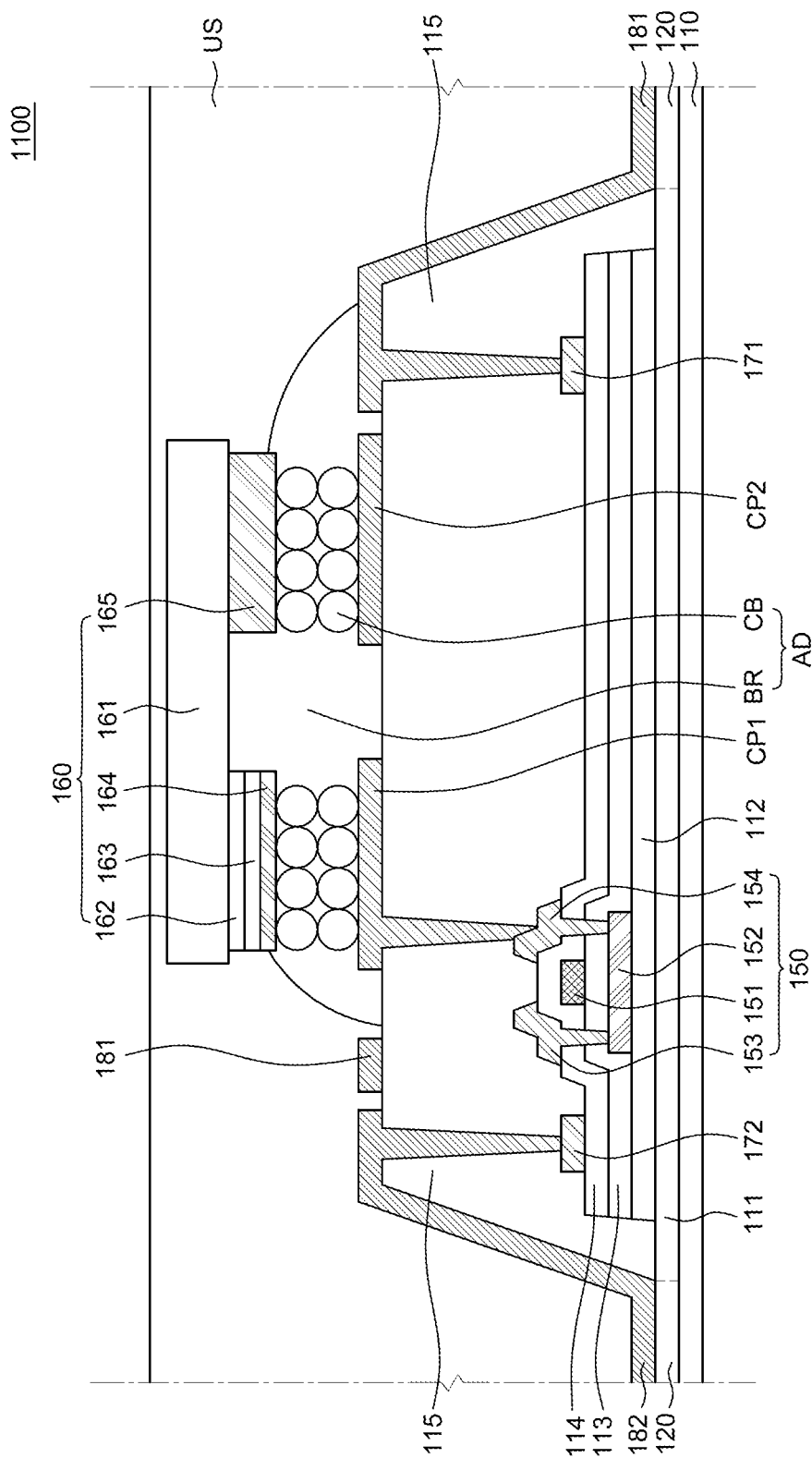
FIG. 11 is a schematic cross-sectional view illustrating that an upper common connection pad has been removed through a repair process of a display device according to an embodiment of the present disclosure.

FIG. 11 is a schematic cross-sectional view illustrating that an upper common connection pad has been removed through a repair process of a display device according to an embodiment of the present disclosure. A display device 1100 shown in FIG. 11 is substantially the same as the display device 100 shown in FIG. 1 through FIG. 4 except that the upper common connection pad CP22 is removed. Thus, a redundant description thereof will be omitted.

Referring to FIG. 11, in the display device 1100 corresponding to the display device 100 shown in FIG. 1 through FIG. 4 after a repair process, the upper common connection pad CP22 of the common connection pad CP2 is removed together with the LEDs 160. Thus, the common connection pad CP2 may have a monolayer structure.

In some of the plurality of sub-pixels SPX of the display device 1100 after a repair process, the common connection pad CP2 may be a single layer as shown in FIG. 11. However, in other sub-pixels SPX, only the LEDs 160 are removed during a repair process and the upper common connection pad CP22 remains. Thus, these sub-pixels SPX may be put in a state as shown in FIG. 1 through FIG. 4.

Also, in some of the plurality of sub-pixels SPX of the display device 1100 after a repair process, only a part of the upper common connection pad CP22 may be removed together with the LEDs 160 and the other part may remain.

Deformation of Adhesive layer

Figure 12A:
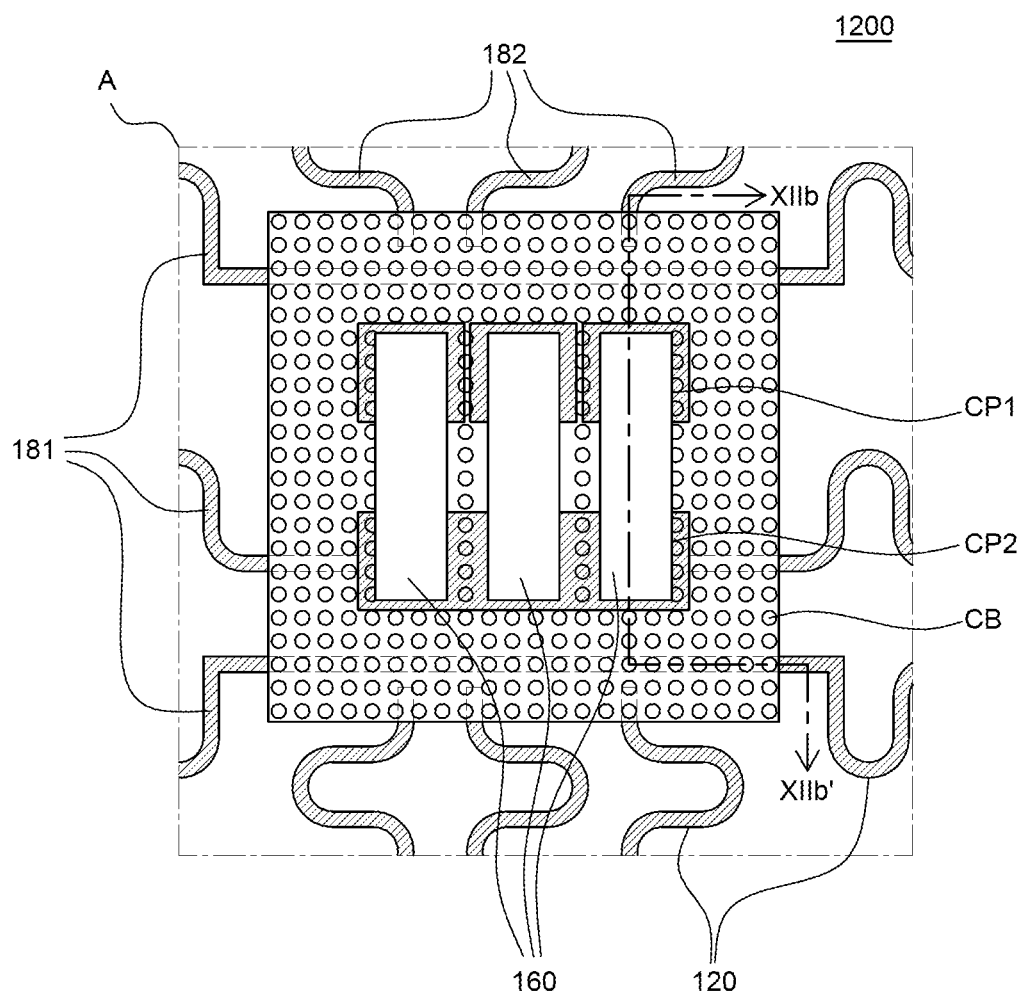
FIG. 12A is an enlarged plan view of one pixel substrate of a display device according to still another embodiment of the present disclosure.
Figure 12B:
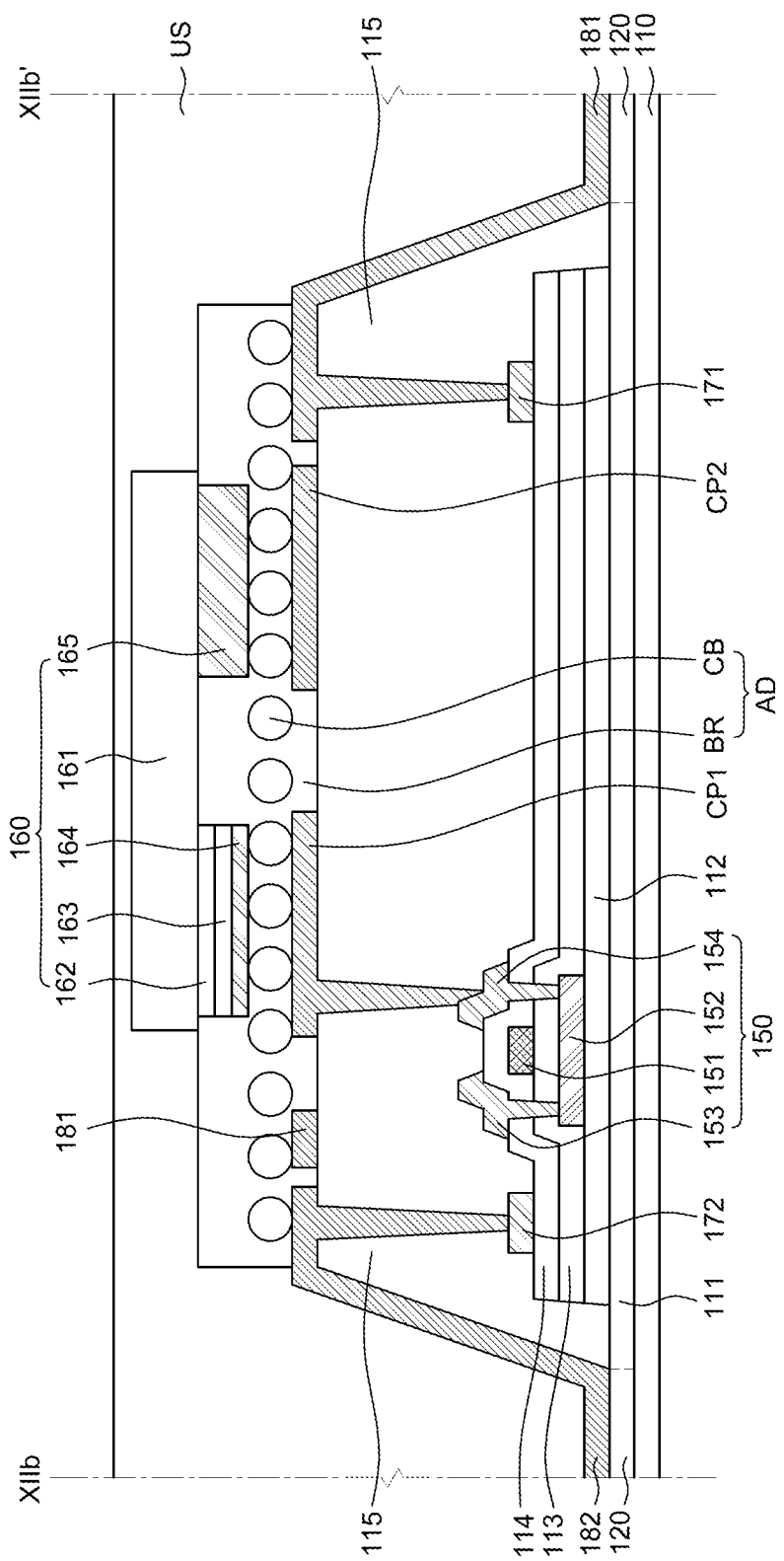
FIG. 12B is a schematic cross-sectional view of one pixel substrate of the display device according to still another embodiment of the present disclosure.

FIG. 12A is an enlarged plan view of one pixel substrate of a display device according to still another embodiment of the present disclosure. FIG. 12B is a schematic cross-sectional view of one pixel substrate of the display device according to still another embodiment of the present disclosure. A display device 1200 shown in FIG. 12A and FIG.

12B is substantially the same as the display device 100 shown in FIG. 1 through FIG. 4 except that the upper common connection pad CP22 is removed, and the adhesive layer AD is disposed differently. Thus, a redundant description thereof will be omitted.

Referring to FIG. 12A and FIG. 12B, the adhesive layer AD is used to electrically connect the plurality of individual connection pads CP1 and the common connection pad CP2 to the plurality of LEDs 160.

The adhesive layer AD is disposed to cover the entire upper surface of the planarization layer 115. The adhesive layer AD is disposed on the entire upper surface of the planarization layer 115 as well as on the upper surfaces of the individual connection pads CP1 and the common connection pad CP2. Thus, the LEDs 160 can be bonded onto the individual connection pads CP1 and the common connection pad CP2. Here, the n-electrode 165 may be disposed on the common connection pad CP2, and the p-electrode 164 may be disposed on the individual connection pads CP1.

The adhesive layer AD includes the plurality of conductive balls CB and the base member BR. The adhesive layer AD may be a conductive adhesive layer formed by dispersing the plurality of conductive balls CB in the base member BR. The plurality of conductive balls CB dispersed in the base member BR may serve to electrically connect an electrode of the LED 160 to the common connection pad CP2 and the individual connection pad CP1 when the electrode of the LED 160 is bonded to the common connection pad CP2 and the individual connection pad CP1.

Figure 13A:
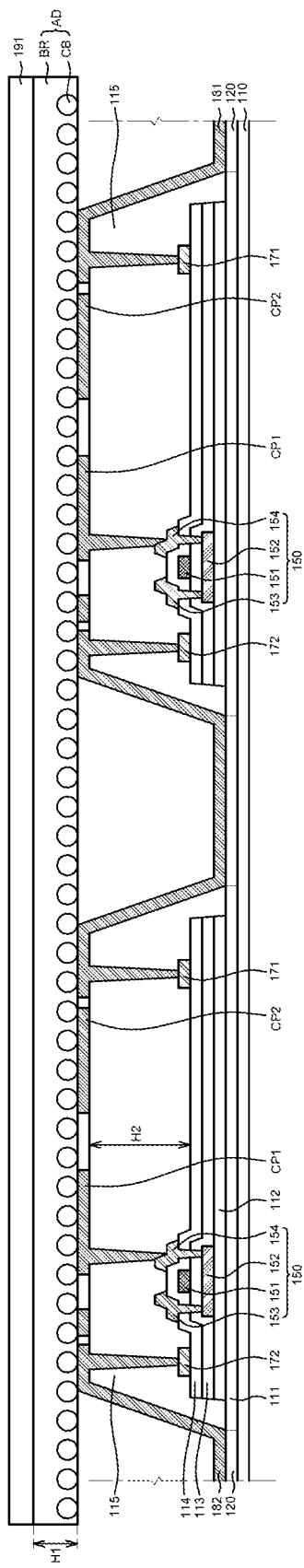
FIG. 13A through FIG. 13D are schematic cross-sectional views illustrating a method of manufacturing the display device according to still another embodiment of the present disclosure.

In some embodiments, the plurality of conductive balls CB is disposed in a single layer. As shown in FIG. 13A, the conductive balls CB are dispersed in the base member BR. The conductive balls CB are spaced apart at a predetermined distance from each other in the single layer. For example, the distance between the conductive balls CB may be from 2 μm to 3 μm but is not limited thereto. Herein, the distance between the conductive balls CB refers to the shortest distance between a conductive ball CB and another conductive ball CB.

Since the plurality of conductive balls CB is spaced apart from each other, the plurality of conductive balls CB is not electrically connected to each other. That is, the plurality of conductive balls CB is spaced apart from each other in parallel with the upper surface of the planarization layer 115 and thus is not electrically connected to each other. Also, the plurality of conductive balls CB electrically connects the plurality of individual connection pads CP1 and the common connection pad CP2 to the plurality of LEDs 160. That is, the plurality of conductive balls CB is in contact with the electrodes of the LEDs 160 and the connection pads in a direction perpendicular to the upper surface of the planarization layer 115. Thus, the plurality of conductive balls CB may electrically connect the electrodes of the LEDs 160 to the connection pads.

The base member BR may be an adhesive member having adhesiveness and insulating properties. The adhesive layer AD except a portion where the conductive balls CB are disposed has insulating properties. The base member BR is coated on the entire upper surface of the planarization layer 115 so that the plurality of LEDs 160 can be fixed in position.

The adhesive layer AD has a smaller thickness or height H1 than the thickness or height H2 of the planarization layer 115 (see for example, FIG. 13A). If the adhesive layer AD has a greater thickness than the planarization layer 115, the adhesive layer AD may flow down to the outside of the upper surface of the planarization layer 115. Thus, misalignment of the LEDs 160 may occur. That is, movement of the adhesive layer AD may be regulated by a step of the planarization layer 115 and a thickness of the adhesive layer AD. Also, the adhesive layer AD may be disposed on the entire upper surface of the planarization layer 115 so that the edges of the upper surface of the planarization layer 115 coincide with the edges of the adhesive layer AD. Meanwhile, a side surface of the adhesive layer AD may be perpendicular to the upper surface of the planarization layer 115 or inclined to the upper surface of the planarization layer 115 but is not limited thereto.

In the display device 1200 according to still another embodiment of the present disclosure, the plurality of conductive balls CB included in the adhesive layer AD is spaced apart from each other in a single layer. Thus, it is possible to suppress the occurrence of a short or open of the LED 160. Also, in the display device 1200 according to still another embodiment of the present disclosure, the adhesive layer AD is disposed on the entire upper surface of the planarization layer 115 instead of being selectively disposed only on the connection pads overlapping with the plurality of LEDs 160. Thus, it is possible to reduce or minimize a transfer efficiency decrease of the LED 160 and defective driving of the LED 160 caused by non-uniform placement of the adhesive layer AD.

Hereinafter, a method of manufacturing the display device 1200 according to still another embodiment of the present disclosure will be described with reference to FIG. 13A through FIG. 13D.

Figure 13B:
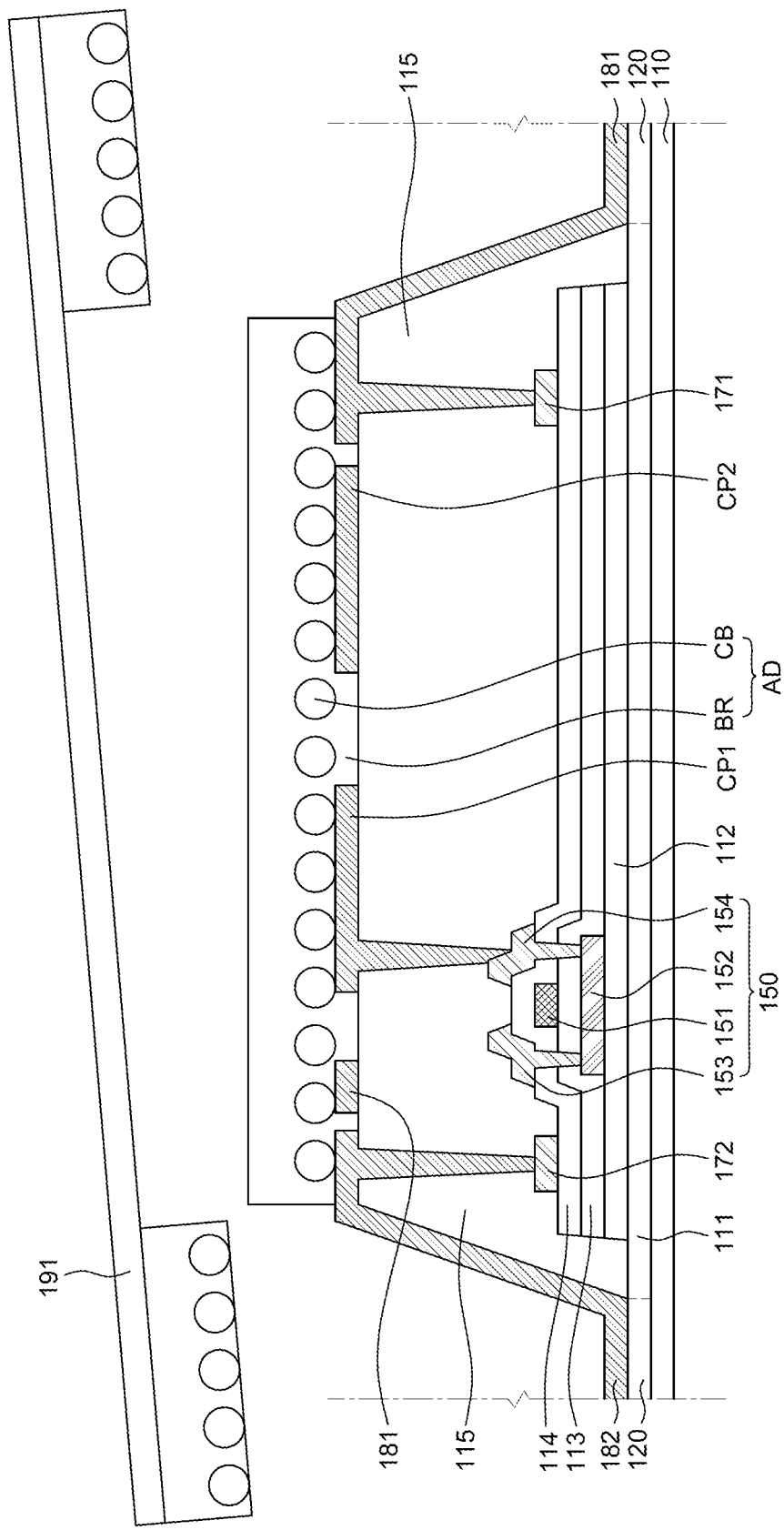
Figure 13C:
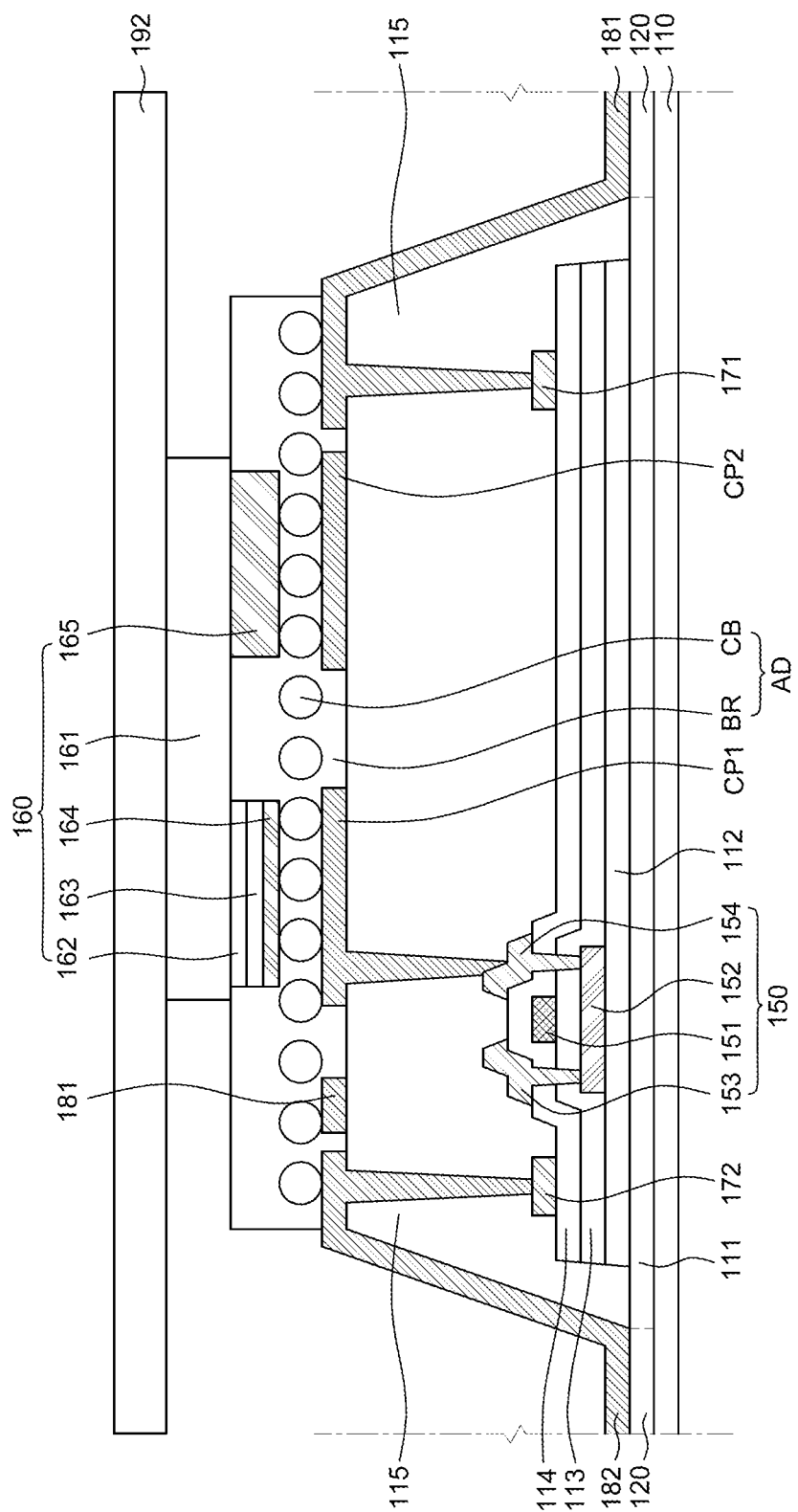
Figure 13D:
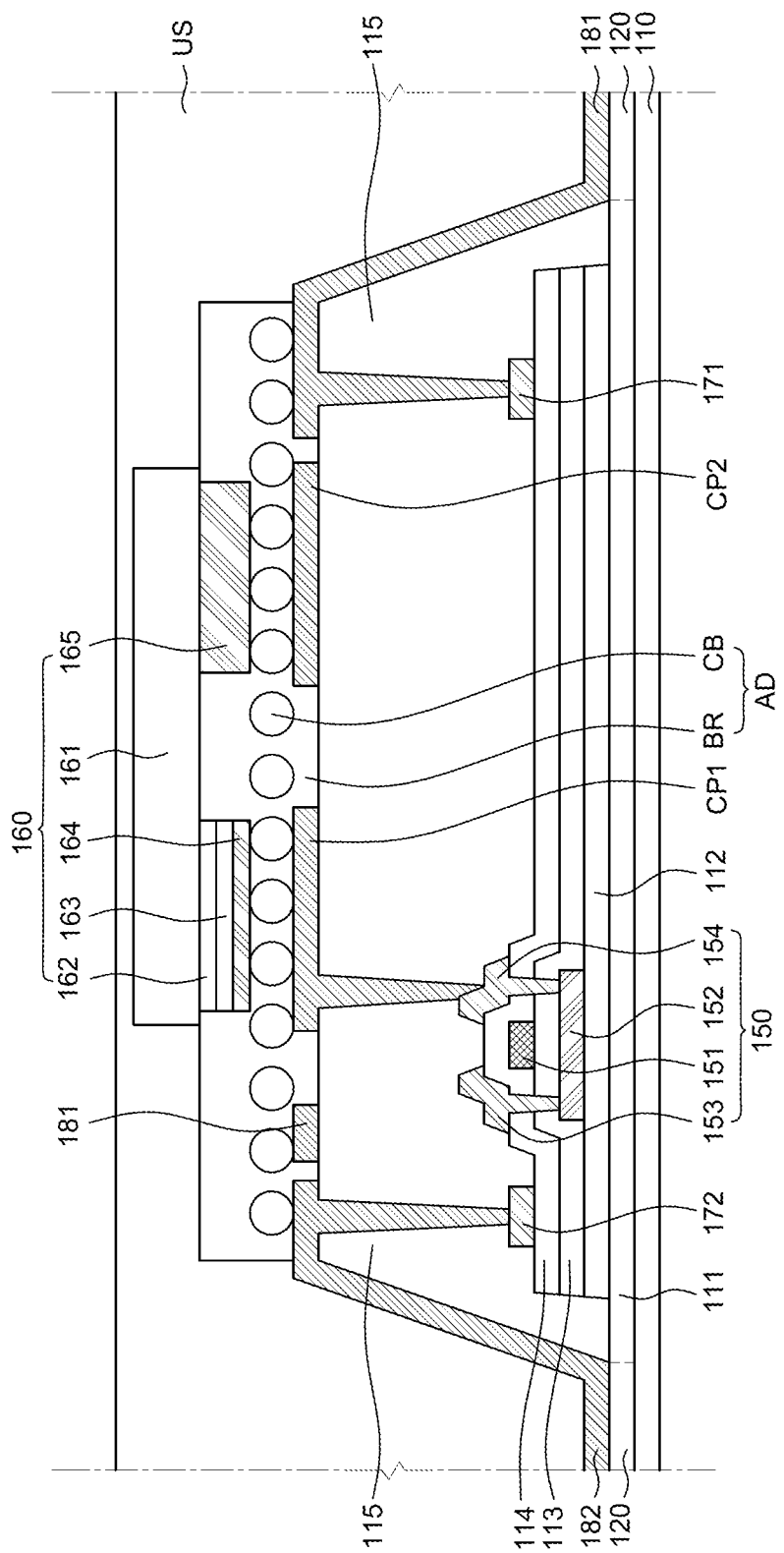

FIG. 13A through FIG. 13D are schematic cross-sectional views illustrating a method of manufacturing the display device according to still another embodiment of the present disclosure. The display device shown in FIG. 13D is substantially the same as the display device 1200 shown in FIG. 12B. Thus, a redundant description thereof will be omitted.

First, referring to FIG. 13A, a first transfer substrate 191, on which the adhesive layer AD including the base member BR and the plurality of conductive balls CB dispersed in the base member BR is disposed, is prepared.

Then, the first transfer substrate 191 is brought close to an upper portion of the lower substrate 110, on which the planarization layer 115 is disposed, and the adhesive layer AD is placed on an upper portion of the planarization layer 115. Here, the first transfer substrate 191 may be in the form of a film but is not limited thereto. While the first transfer substrate 191 and the lower substrate 110 are kept in a flat state, the adhesive layer AD is pressed for a predetermined period of time to be bonded onto the planarization layer 115.

Then, referring to FIG. 13B, the first transfer substrate 191 is separated from the adhesive layer AD. Only a portion of the first transfer substrate 191, on which the planarization layer 115 is disposed, is locally heated so that the adhesive layer AD is bonded only onto the planarization layer 115. For example, a heating bar is brought into contact with an area corresponding to the planarization layer 115 while being pressed thereto to separate only the adhesive layer AD bonded to the upper surface of the planarization layer 115 from the first transfer substrate 191. However, the present disclosure is not limited thereto. Then, when the first transfer substrate 191 is removed, the adhesive layer AD is disposed only on the planarization layer 115.

Then, referring to FIG. 13C, a second transfer substrate 192, on which the plurality of LEDs 160 is disposed, is brought close to an upper portion of the adhesive layer AD and the plurality of LEDs 160 is bonded to the upper portion of the adhesive layer AD. For example, the plurality of LEDs 160 is transferred in a state where the plurality of LEDs 160 is bonded by an adhesive member on the second transfer substrate 192. The plurality of LEDs 160 disposed on the second transfer substrate 192 is bonded to the upper portion of the adhesive layer AD so that the plurality of LEDs 160 is located above the connection pads of the lower substrate 110. When a laser is irradiated to the plurality of LEDs 160, the adhesive member is removed, and the plurality of LEDs 160 is separated from the second transfer substrate 192 and fixed onto the connection pads by the adhesive layer AD.

Then, referring to FIG. 13D, the upper substrate US may be formed by coating and hardening a bendable or stretchable insulating material on the plurality of LEDs 160. Thus, the upper substrate US may be disposed to be in contact with the lower substrate 110, the pixel substrate 111, the connection member 120 and the connection lines 181 and 182. As a result, the display device 1200 shown in FIG. 12B can be manufactured.

In general, when an adhesive layer is transferred, an inkjet printing process is used to selectively transfer the adhesive layer only onto an area where an electrode of a light emitting diode is disposed or a connection pad disposed on a planarization layer. However, if the adhesive layer is transferred through the inkjet printing process, the transfer is limited due to a high viscosity of the adhesive layer. Also, the inkjet printing process is a complicated process and requires a costly device.

However, according to the method of manufacturing the display device 1200 according to still another embodiment of the present disclosure, the adhesive layer AD is bonded onto the planarization layer 115 and then the LEDs is bonded thereto. Thus, it is possible to simplify a manufacturing process and reduce manufacturing time and cost. That is, an adhesive layer has been disposed only on a part of a planarization layer, whereas the adhesive layer AD is disposed on the entire upper surface of the planarization layer 115 in a greater area. Therefore, the adhesive layer AD can be more easily bonded, and the LEDs 160 can be easily fixed in position by the adhesive layer AD. Also, the adhesive layer AD is evenly coated on the planarization layer 115. Therefore, it is possible to improve a transfer efficiency of the LEDs 160, reduce manufacturing time and minimize defective driving of the LEDs 160.

The embodiments of the present disclosure can also be described as follows:

According to an aspect of the present disclosure, the display device may include, a lower substrate and a plurality of pixel substrates disposed on the lower substrate. The display device also includes a plurality of transistors disposed on the plurality of pixel substrates and a planarization layer disposed on the plurality of pixel substrates to cover upper portions of the plurality of transistors. The display device further includes a plurality of individual connection pads and a common connection pad disposed on the planarization layer. The display device also includes a plurality of light emitting diodes disposed on the plurality of individual connection pads and the common connection pad. At least one of the plurality of individual connection pads and the common connection pad may have a multilayer structure.

The common connection pad may include a lower common connection pad disposed on the planarization layer and an upper common connection pad disposed on the lower common connection pad.

The upper common connection pad may be made of a material having a higher adhesiveness to electrodes of the plurality of light emitting diodes than the lower common connection pad.

The lower common connection pad may be made of copper (Cu), and the upper common connection pad may be made of gold (Au), titanium (Ti), aluminum (Al) or molybdenum (Mo).

The upper common connection pad may be disposed on an edge of the lower common connection pad.

The upper common connection pad may be further disposed on the lower common connection pad corresponding to a space between the plurality of individual connection pads.

The upper common connection pad may be disposed in a mesh form on the lower common connection pad.

The plurality of individual connection pads may include a lower individual connection pad disposed on the planarization layer and an upper individual connection pad disposed on the lower individual connection pad. The upper individual connection pad may have a shape corresponding to the upper common connection pad and is disposed on the lower individual connection pad.

The display device may further comprise a power line disposed on the planarization layer and an insulating layer disposed on the power line.

The insulating layer may include a plurality of insulating patterns disposed on the power line.

The insulating layer, a portion relatively adjacent to the common connection pad may have a smaller height than a portion relatively far from the common connection pad.

The insulating layer may be disposed to cover a side surface of the power line adjacent to the common connection pad.

A distance between the plurality of individual connection pads and the common connection pad may be greater than a distance between the common connection pad and the power line.

According to another aspect of the present disclosure, the display device may include, a plurality of pixel substrates which is disposed on a lower substrate and in which a plurality of light emitting diodes is disposed. The display device also includes a planarization layer covering upper portions of the plurality of pixel substrates. The display device further includes a plurality of individual connection pads disposed on the planarization layer so as to correspond to the plurality of light emitting diodes, respectively. The display device also includes a common connection pad disposed on the planarization layer and electrically connected to all of the plurality of light emitting diodes. The display device further includes an adhesive layer electrically connecting the plurality of individual connection pads and the common connection pad to the plurality of light emitting diodes. At least one of the plurality of individual connection pads and the common connection pad may have a lower pad and an upper pad disposed on an edge of the lower pad.

The upper pad may be made of a different material from the lower pad.

The upper pad may be disposed in a mesh form on the lower pad.

The display device may further comprise, a high-potential power line disposed on the planarization layer; and an insulating layer disposed on the high-potential power line. The common connection pad may be disposed between the plurality of individual connection pads and the high-potential power line.

The insulating layer may be disposed to cover a side surface of the high-potential power line.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a lower substrate;
a plurality of pixel substrates disposed on the lower substrate;
a plurality of transistors disposed on the plurality of pixel substrates;
a planarization layer disposed on the plurality of pixel substrates to cover upper portions of the plurality of transistors;
a plurality of individual connection pads disposed on the planarization layer;
a common connection pad disposed on the planarization layer;
a plurality of light emitting diodes disposed on the plurality of individual connection pads and the common connection pad; and
an adhesive layer electrically connecting the plurality of individual connection pads and the common connection pad to the plurality of light emitting diodes,
wherein at least one of the plurality of individual connection pads and the common connection pad has a multilayer structure, and
wherein at least one pixel substrate of the plurality of pixel substrates is between the lower substrate and the plurality of transistors.

2. The display device according to claim 1, wherein the common connection pad includes a lower common connection pad disposed on the planarization layer and an upper common connection pad disposed on the lower common connection pad.

3. The display device according to claim 2, wherein the upper common connection pad is made of a material having a higher adhesiveness to electrodes of the plurality of light emitting diodes than the lower common connection pad.

4. The display device according to claim 3, wherein the lower common connection pad is made of copper (Cu), and
wherein the upper common connection pad is made of gold (Au), titanium (Ti), aluminum (Al) or molybdenum (Mo).

5. The display device according to claim 3, wherein the lower common connection pad includes copper, and
wherein the upper common connection pad includes a material chosen from gold, titanium, aluminum or molybdenum.

6. The display device according to claim 2, wherein the upper common connection pad is disposed on an edge of the lower common connection pad.

7. The display device according to claim 6, wherein the upper common connection pad is further disposed on the lower common connection pad corresponding to a space between the plurality of individual connection pads.

8. The display device according to claim 7, wherein the upper common connection pad is disposed in a mesh form on the lower common connection pad.

9. The display device according to claim 2, wherein the plurality of individual connection pads includes a lower individual connection pad disposed on the planarization layer and an upper individual connection pad disposed on the lower individual connection pad, and
wherein the upper individual connection pad has a shape corresponding to the upper common connection pad and is disposed on the lower individual connection pad.

10. The display device according to claim 1, further comprising:
a power line disposed on the planarization layer; and
an insulating layer disposed on the power line.

11. The display device according to claim 10, wherein the insulating layer includes a plurality of insulating patterns disposed on the power line.

12. The display device according to claim 10, wherein in the insulating layer, a portion relatively adjacent to the common connection pad has a smaller height than a portion relatively far from the common connection pad.

13. The display device according to claim 10, wherein the insulating layer is disposed to cover a side surface of the power line adjacent to the common connection pad.

14. The display device according to claim 10, wherein a distance between the plurality of individual connection pads and the common connection pad is greater than a distance between the common connection pad and the power line.

15. A display device, comprising:
a plurality of pixel substrates which is disposed on a lower substrate and in which a plurality of light emitting diodes is disposed, the plurality of pixel substrates being spaced apart from each other;
a planarization layer covering upper portions of the plurality of pixel substrates;
a plurality of individual connection pads disposed on the planarization layer so as to correspond to the plurality of light emitting diodes, respectively;
a common connection pad disposed on the planarization layer and electrically connected to all of the plurality of light emitting diodes; and
an adhesive layer electrically connecting the plurality of individual connection pads and the common connection pad to the plurality of light emitting diodes,
wherein at least one of the plurality of individual connection pads and the common connection pad has a lower pad and an upper pad disposed on an edge of the lower pad.

16. The display device according to claim 15, wherein the upper pad is made of a different material from the lower pad.

17. The display device according to claim 15, wherein the upper pad is disposed in a mesh form on the lower pad.

18. The display device according to claim 15, further comprising:
a first potential power line disposed on the planarization layer; and
an insulating layer disposed on the first potential power line,
wherein the common connection pad is disposed between the plurality of individual connection pads and the first potential power line.

19. The display device according to claim 18, wherein the insulating layer is disposed to cover a side surface of the first potential power line.

20. A display device, comprising:
a lower substrate having thereon a display area and a non-display area adjacent to the display area;
a plurality of pixel substrates and a plurality of non-pixel substrates disposed on the lower substrate, the plurality of pixel substrates having thereon a plurality of light emitting diodes in the display area, the plurality of non-pixel substrates in the non-display area;
a planarization layer covering upper portions of the plurality of pixel substrates;
a plurality of individual connection pads disposed on the planarization layer and corresponding to the plurality of light emitting diodes, respectively;
a common connection pad disposed on the planarization layer and electrically connected to all of the plurality of light emitting diodes; and
an adhesive layer electrically connecting the plurality of individual connection pads and the common connection pad to the plurality of light emitting diodes and disposed to cover the entire upper surface of the planarization layer.

21. The display device according to claim 20, wherein the adhesive layer includes a plurality of conductive balls and a base member, and
wherein the plurality of conductive balls is disposed in a single layer as being dispersed in the base member.

22. The display device according to claim 21, wherein each of the plurality of conductive balls are spaced apart from each other and not electrically connected to each other, and each plurality respectively electrically connects the plurality of individual connection pads and the common connection pad to the plurality of light emitting diodes.

23. The display device according to claim 21, a thickness of the adhesive layer is equal to or smaller than that of the planarization layer.

* * * * *